United States Patent
Lee et al.

(10) Patent No.: US 12,408,544 B2
(45) Date of Patent: Sep. 2, 2025

(54) DISPLAY PANEL AND DISPLAY APPARATUS INCLUDING THE SAME

(71) Applicant: SAMSUNG DISPLAY CO., LTD., Yongin-si (KR)

(72) Inventors: Dongsung Lee, Yongin-si (KR); Yonghoon Kwon, Yongin-si (KR); Misun Kim, Yongin-si (KR); Sehun Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 497 days.

(21) Appl. No.: 17/974,180

(22) Filed: Oct. 26, 2022

(65) Prior Publication Data
US 2023/0130999 A1    Apr. 27, 2023

(30) Foreign Application Priority Data

Oct. 26, 2021  (KR) .................. 10-2021-0143729

(51) Int. Cl.
*H10K 77/10*  (2023.01)
*H10K 50/84*  (2023.01)
*H10K 59/12*  (2023.01)

(52) U.S. Cl.
CPC ......... *H10K 77/111* (2023.02); *H10K 50/841* (2023.02); *H10K 59/12* (2023.02)

(58) Field of Classification Search
CPC .... H10K 77/111; H10K 50/841; H10K 59/12; H10K 2102/311
See application file for complete search history.

(56) References Cited

U.S. PATENT DOCUMENTS

| | | | |
|---|---|---|---|
| 9,430,180 B2 | 8/2016 | Hirakata et al. | |
| 10,569,501 B2 | 2/2020 | Lim et al. | |
| 10,748,973 B2 | 8/2020 | Han et al. | |
| 11,528,812 B2 | 12/2022 | Ahn et al. | |
| 11,770,893 B2 | 9/2023 | Song et al. | |
| 12,213,373 B2 | 1/2025 | Kwon et al. | |
| 2020/0004295 A1 | 1/2020 | Paek et al. | |
| 2020/0361197 A1 | 11/2020 | Yang | |
| 2021/0104693 A1 | 4/2021 | Cho et al. | |
| 2021/0118337 A1 | 4/2021 | Park et al. | |

FOREIGN PATENT DOCUMENTS

| | | |
|---|---|---|
| CN | 110854130 A | 2/2020 |
| KR | 1020180059645 A | 6/2018 |
| KR | 1020180068382 A | 6/2018 |
| KR | 1020200002576 A | 1/2020 |

(Continued)

*Primary Examiner* — J. E. Schoenholtz
(74) *Attorney, Agent, or Firm* — CANTOR COLBURN LLP

(57) ABSTRACT

Display panel and display apparatus including the same are disclosed. The display panel includes a substrate including a main display area disposed at a center thereof, a plurality of sub display areas disposed outside the main display area, and a display panel corner area disposed between sub display areas of the plurality of sub display areas adjacent to each other and arranged at a corner of the substrate; and display elements arranged on the substrate. A bent groove is defined in the substrate, and arranged between the main display area and at least one sub display area of the plurality of sub display areas of the substrate, and between the main display area and the display panel corner area.

20 Claims, 30 Drawing Sheets

(56) References Cited

FOREIGN PATENT DOCUMENTS

| | | | |
|---|---|---|---|
| KR | 1020200063379 | A | 6/2020 |
| KR | 1020210041664 | A | 4/2021 |
| KR | 1020210047616 | A | 4/2021 |
| KR | 1020210054637 | A | 5/2021 |
| KR | 1020210073662 | A | 6/2021 |

DISPLAY PANEL AND DISPLAY APPARATUS INCLUDING THE SAME

This application claims priority to Korean Patent Application No. 10-2021-0143729, filed on Oct. 26, 2021, and all the benefits accruing therefrom under 35 U.S.C. § 119, the content of which in its entirety is herein incorporated by reference.

BACKGROUND

1. Field

Embodiments relate to apparatuses, and more particularly, to a display panel and a display apparatus.

2. Description of the Related Art

Electronic apparatuses based on mobility are being widely used. Recently, in addition to small electronic apparatuses such as mobile phones, tablet personal computers are being widely used as mobile electronic apparatuses.

Such mobile electronic apparatuses include a display to provide visual information such as images or videos to a user in order to support various functions. Recently, as other components for driving a display are being miniaturized, a proportion of an electronic apparatus occupied by a display is gradually increasing and a structure capable of being bent from a flat state to have a predetermined angle is also being developed.

SUMMARY

Embodiments include a display panel and a display apparatus that include a curved corner and are capable of displaying an image at the curved corner.

Additional features will be set forth in part in the description which follows and, in part, will be apparent from the description, or may be learned by practice of the presented embodiments of the invention.

In an embodiment of the invention, a display panel includes a substrate including a main display area disposed at a center thereof, a plurality of sub display areas arranged outside the main display area, and a display panel corner area disposed between sub display areas of the plurality of sub display areas adjacent to each other and arranged at a corner of the substrate, and display elements arranged on the substrate. A bent groove is defined in the substrate, between the main display area and at least one sub display area of the plurality of sub display areas of the substrate, and between the main display area and the display panel corner area.

In an embodiment, an inner surface of the bent groove may be rounded.

In an embodiment, an edge of the bent groove may be inclined.

In an embodiment, an edge of the bent groove may be stepped.

In an embodiment, the bent groove may be defined in a closed loop shape along an edge of the substrate.

In an embodiment, the bent groove may be provided in plural, and a plurality of bent grooves may be defined between the main display area and an edge of the substrate to be spaced apart from each other.

In an embodiment, at least one of the plurality of bent grooves may overlap a boundary between the main display area and the sub display area of the substrate and a boundary between the main display area and the display panel corner area.

In an embodiment, the bent groove may be provided in plural, and a plurality of bent grooves may be spaced apart from each other along a closed loop line, and overlap a line segment formed along a boundary between the main display area and the sub display area of the substrate and a boundary between the main display area and the display panel corner area.

In an embodiment of the invention, a display apparatus includes a cover window including a curved corner, and a display panel disposed on the cover window and including display elements, a main display area, a sub display area and a display panel corner area facing the curved corner of the cover window. The display panel includes a substrate on which the display elements are arranged. A bent groove is defined in the substrate, between the main display area and the sub display area and between the main display area and the display panel corner area.

In an embodiment, an inner surface of the bent groove may be rounded.

In an embodiment, an edge of an inner surface of the bent groove may be inclined.

In the present embodiments, an edge of an inner surface of the bent groove may be stepped.

In an embodiment, the bent groove may be defined in a closed loop shape along an edge of the substrate.

In an embodiment, the bent groove may overlap a boundary between the main display area and the sub display area and a boundary between the main display area and the display panel corner area.

In an embodiment, the display elements may be arranged in the main display area, the sub display area, and the display panel corner area to be spaced apart from each other.

In an embodiment, the bent groove may be provided in plural, and a plurality of bent grooves may be arranged between the main display area and an edge of the substrate to be spaced apart from each other.

In an embodiment, at least one of the plurality of bent grooves may overlap a boundary between the main display area and the sub display area and a boundary between the main display area and the display panel corner area.

In an embodiment, the bent groove may be provided in plural, and the plurality of bent grooves may be spaced apart from each other along a closed loop line, and overlap a line segment formed along a boundary between the main display area and the sub display area and a boundary between the main display area and the display panel corner area.

In an embodiment, the display apparatus may further include a first protection member disposed under the display panel.

In an embodiment, the display apparatus may further include a second protection member disposed under the first protection member.

Other features and advantages other than those described above will become apparent from the accompanying drawings, the appended claims, and the detailed description of the invention.

BRIEF DESCRIPTION OF THE DRAWINGS

The above and other features and advantages of embodiments of the invention will be more apparent from the following description taken in conjunction with the accompanying drawings, in which.

DETAILED DESCRIPTION

Figure 1A:
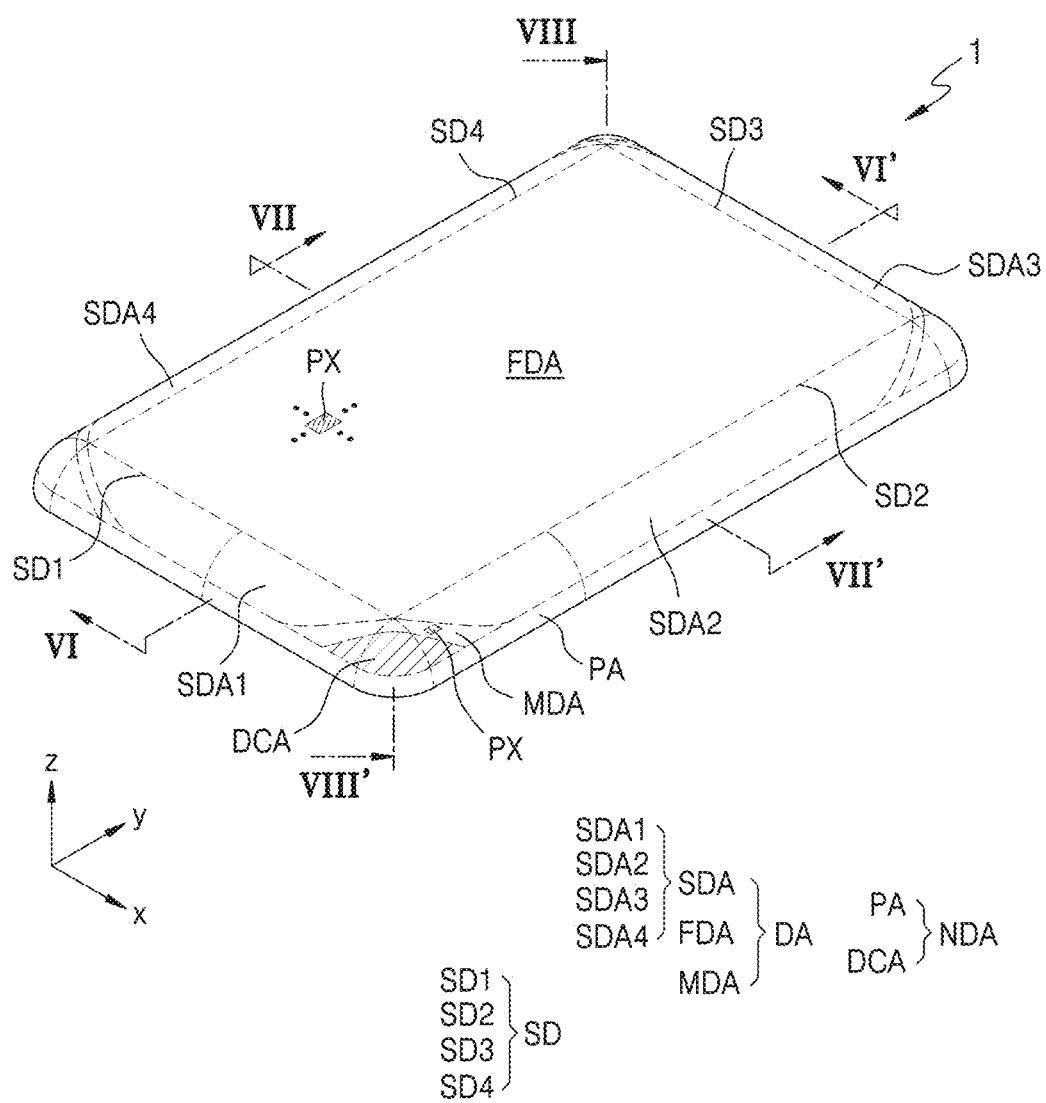
FIG. 1A is a perspective view schematically illustrating an embodiment of a display apparatus.

Reference will now be made in detail to embodiments, examples of which are illustrated in the accompanying drawings, where like reference numerals refer to like elements throughout. In this regard, the illustrated embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or variations thereof.

The disclosure may include various embodiments and modifications, and predetermined embodiments thereof are illustrated in the drawings and will be described herein in detail. The effects and features of the disclosure and the accomplishing methods thereof will become apparent from the embodiments described below in detail with reference to the accompanying drawings. However, the invention is not limited to the embodiments described below and may be embodied in various modes.

Hereinafter, embodiments will be described in detail with reference to the accompanying drawings, and in the following description, like reference numerals will denote like elements and redundant descriptions thereof will be omitted for conciseness.

It will be understood that although terms such as "first" and "second" may be used herein to describe various elements, these elements should not be limited by these terms and these terms are only used to distinguish one element from another element.

As used herein, the singular forms "a," "an," and "the" are intended to include the plural forms as well, unless the context clearly indicates otherwise.

Also, it will be understood that the terms "comprise," "include," and "have" used herein specify the presence of stated features or elements, but do not preclude the presence or addition of one or more other features or elements.

It will be understood that when a layer, region, area, component, or element is referred to as being "on" another layer, region, area, component, or element, it may be "directly on" the other layer, region, area, component, or element or may be "indirectly on" the other layer, region, area, component, or element with one or more intervening layers, regions, areas, components, or elements therebetween.

Sizes of elements in the drawings may be exaggerated for convenience of description. In other words, because the sizes and thicknesses of elements in the drawings are arbitrarily illustrated for convenience of description, the invention is not limited thereto.

Also, herein, the x axis, the y axis, and the z axis are not limited to three axes of the quadrangular (e.g., rectangular) coordinate system and may be interpreted in a broader sense. In an embodiment, the x axis, the y axis, and the z axis may be perpendicular to one another or may represent different directions that are not perpendicular to one another, for example.

When an embodiment may be implemented differently, a particular process order may be performed differently from the described order. Two consecutively described processes may be performed substantially at the same time or may be performed in an order opposite to the described order, for example.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, ±20%, ±10%, ±5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

FIG. 1A is a perspective view schematically illustrating an embodiment of a display apparatus.

Referring to FIG. 1A, a display apparatus 1 may be used as a display screen of various products such as televisions, notebook computers, monitors, billboards, and internet of things ("IoT") device as well as portable electronic apparatuses such as mobile phones, smart phones, tablet personal computers, mobile communication terminals, electronic notebooks, electronic books, portable multimedia players ("PMPs"), navigation, and ultra-mobile personal computers ("UMPCs").

In an embodiment, the display apparatus 1 may have a quadrangular (e.g., rectangular) shape in the plan view. In an alternative embodiment, the display apparatus 1 may have various shapes such as polygonal shapes such as triangular shapes and square shapes, circular shapes, and elliptical shapes. In an embodiment, when the display apparatus 1 has a polygonal shape in the plan view, a polygonal corner may be rounded. Hereinafter, for convenience of description, a case where the display apparatus 1 has a quadrangular (e.g., rectangular) shape with a rounded corner in the plan view will be mainly described.

The display apparatus 1 may have a short side in a first direction (e.g., the x direction or the –x direction) and a long side in a second direction (e.g., the y direction or the –y direction). In another embodiment, in the display apparatus 1, the length of the side in the first direction (e.g., the x direction or the –x direction) may be equal to the length of the side in the second direction (e.g., the y direction or the –y direction). In another embodiment, the display apparatus 1 may have a long side in the first direction (e.g., the x direction or the –x direction) and a short side in the second direction (e.g., the y direction or the –y direction).

Each corner where the short side in the first direction (e.g., the x direction or the –x direction) and the long side in the second direction (e.g., the y direction or the –y direction) meet each other may be rounded to have a predetermined curvature.

The display apparatus 1 may include a display area DA and a non-display area NDA disposed outside the display area DA. A plurality of pixels PX may be arranged as display elements in the display area DA, and an image may be provided through an array of the plurality of pixels PX. The pixel PX may be defined as an area where light is emitted by light-emitting devices included in the display apparatus 1. In an embodiment, each of the plurality of pixels PX may include a red subpixel, a green subpixel, and a blue subpixel, for example. In an alternative embodiment, each of the plurality of pixels PX may include a red subpixel, a green subpixel, a blue subpixel, and a white subpixel.

In an embodiment, the display area DA may include a main display area FDA, a sub display area SDA, and an intermediate display area MDA. A plurality of pixels PX may be arranged in each of the main display area FDA, the sub display area SDA, and the intermediate display area MDA.

The main display area FDA may include a flat surface. In an embodiment, the percentage of the main display area FDA in the display area DA of the display apparatus 1 may be the greatest, and thus, the main display area FDA may provide most images.

At least a portion of the sub display area SDA may be bent to include a curved surface and may extend outward from each edge SD of the main display area FDA. In an embodiment, the sub display area SDA may include a first sub display area SDA1, a second sub display area SDA2, a third sub display area SDA3, and a fourth sub display area SDA4. In some embodiments, at least one of the first sub display area SDA1, the second sub display area SDA2, the third sub display area SDA3, and the fourth sub display area SDA4 may be omitted.

In an embodiment, the first sub display area SDA1 may be adjacent to a first edge SD1 of the main display area FDA and may extend outwardly from the first edge SD1 in the –y direction. The second sub display area SDA2 may be adjacent to a second edge SD2 of the main display area FDA and may extend outwardly from the second edge SD2 in the x direction. The third sub display area SDA3 may be adjacent to a third edge SD3 of the main display area FDA and may extend outward from the third edge SD3 in the y direction. The fourth sub display area SDA4 may be adjacent to a fourth edge SD4 of the main display area FDA and may extend outwardly from the fourth edge SD4 in the –x direction. In this case, the first sub display area SDA1 and the third sub display area SDA3 may be located on opposite sides with the main display area FDA therebetween, and the second sub display area SDA2 and the fourth sub display area SDA4 may be located on opposite sides with the main display area FDA therebetween.

As illustrated in FIG. 1A, each of the first to fourth sub display areas SDA1, SDA2, SDA3, and SDA4 may include a curved surface bent with a predetermined curvature. In an embodiment, the first sub display area SDA1 and the third sub display area SDA3 have a curved surface bent around a bending axis extending in the x direction, and the second sub display area SDA2 and the fourth sub display area SDA4 may have a curved surface bent around a bending axis extending in the y direction, for example. The respective curvatures of the first to fourth sub display areas SDA1, SDA2, SDA3, and SDA4 may be equal to or different from each other. In an embodiment, the curvature of the first sub display area SDA1 and the curvature of the third sub display area SDA3 may be equal to each other, and the curvature of the second sub display area SDA2 and the curvature of the fourth sub display area SDA4 may be equal to each other, for example. In an embodiment, the curvature of the first sub display area SDA1 may be different from the curvature of the second sub display area SDA2, for example. In another embodiment, the curvature of the first sub display area SDA1 may be equal to the curvature of the second sub display area SDA2.

The intermediate display area MDA may be disposed between the main display area FDA and a display apparatus corner area DCA described below. Also, the intermediate display area MDA may be located between the sub display area SDA and the display apparatus corner area DCA. The intermediate display area MDA may extend between the main display area FDA and the display apparatus corner area DCA and between the sub display area SDA and the display apparatus corner area DCA. As illustrated in FIG. 1A, when the display apparatus 1 has a quadrangular (e.g., rectangular) shape in the plan view, four intermediate display areas MDA may be provided.

In an embodiment, the intermediate display area MDA may include not only a plurality of pixels PX but also a driver for providing an electrical signal or power to each display area DA. In some embodiments, the pixels PX disposed in the intermediate display area MDA may overlap an upper portion of a driver or the like disposed in the intermediate display area MDA. In some embodiments, a pixel circuit for driving the pixels PX disposed in the intermediate display area MDA may be included in the main display area FDA, the sub display area SDA, and/or the display apparatus corner area DCA adjacent to the intermediate display area MDA.

The display apparatus 1 of FIG. 1A may display an image not only in the main display area FDA but also in the sub display area SDA and the intermediate display area MDA. Thus, the percentage of the display area DA in the display apparatus 1 may increase. That is, in the display apparatus 1 having the same size, the area of the non-display area NDA may decrease and the area of the display area DA may increase.

The pixel PX may not be disposed in the non-display area NDA of the display apparatus 1, and thus, the non-display area NDA may be an area not providing an image. The non-display area NDA may include a peripheral area PA outside the display area DA. The peripheral area PA may surround an entirety of the display area DA or only a portion of the display area DA. A driver or the like for providing an electrical signal or power to the display area DA may be disposed in the peripheral area PA.

In an embodiment, the non-display area NDA may include a display apparatus corner area DCA. The display apparatus corner area DCA may be disposed at a corner side where two adjacent edges of the main display area FDA meet each other. In an embodiment, the display apparatus corner area DCA may be disposed at a corner side where the first edge SD1 and the second edge SD2 of the main display area FDA meet each other, and the display apparatus corner area DCA may be adjacent to the first sub display area SDA1 and the second sub display area SDA2, for example. As illustrated in FIG. 1A, when the display apparatus 1 has a quadrangular (e.g., rectangular) shape in the plan view, four display apparatus corner areas DCA may be provided.

Because the display apparatus corner area DCA is disposed between adjacent sub display areas SDA having curved surfaces bent in different directions, the display apparatus corner area DCA may include a curved surface formed or provided by continuously connecting curved surfaces bent in various directions. Also, when the respective curvatures of adjacent sub display areas SDA are different from each other, the curvature of the display apparatus corner area DCA may change gradually along the edge of the display apparatus 1. In an embodiment, when the curvature of the first sub display area SDA1 and the curvature of the second sub display area SDA2 are different from each other, the display apparatus corner area DCA between the first sub display area SDA1 and the second sub display area SDA2 may have a curvature that changes gradually according to positions, for example.

Although the first sub display area SDA1 and the second sub display area SDA2 and the display apparatus corner area DCA therebetween are described in an embodiment, the disclosure may also be similarly applied to the other three display apparatus corner areas DCA.

Figure 1B:
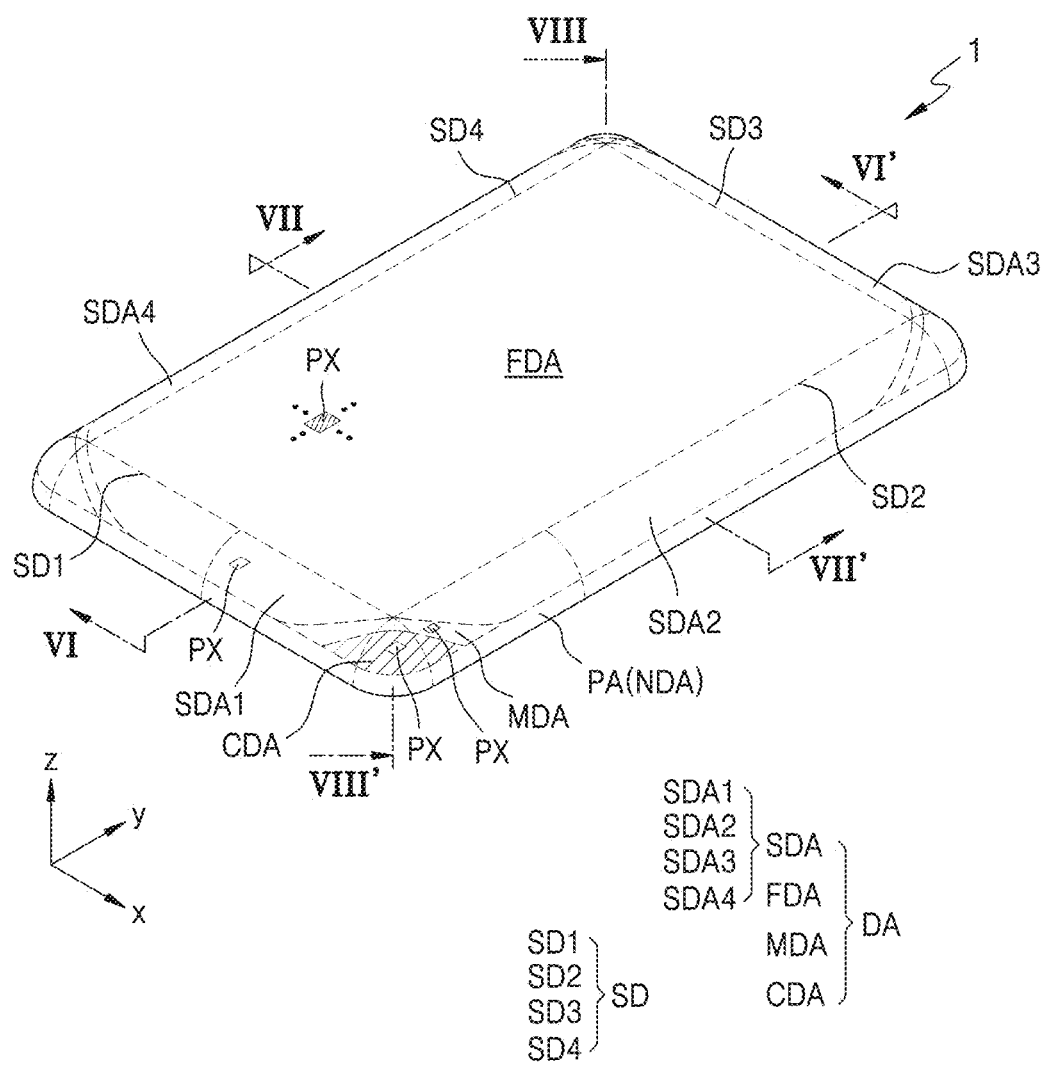
FIG. 1B is a perspective view schematically illustrating another embodiment of a display apparatus.

FIG. 1B is a perspective view schematically illustrating another embodiment of a display apparatus. The descriptions already given above with reference to FIG. 1A will be omitted, and differences therebetween will be mainly described below.

Referring to FIG. 1B, the display area DA may include a main display area FDA, a sub display area SDA, an intermediate display area MDA, and a corner display area CDA. A plurality of pixels PX may be arranged in each of the main display area FDA, the sub display area SDA, the intermediate display area MDA, and the corner display area CDA. The descriptions of the main display area FDA and the sub display area SDA may be the same as those given above with reference to FIG. 1, and thus, redundant descriptions thereof will be omitted for conciseness.

The intermediate display area MDA may be disposed between the main display area FDA and the corner display area CDA described below. Also, the intermediate display area MDA may be located between the sub display area SDA and the corner display area CDA. The intermediate display area MDA may extend between the main display area FDA and the corner display area CDA and between the sub display area SDA and the corner display area CDA. As illustrated in FIG. 1B, when the display apparatus 1 has a quadrangular (e.g., rectangular) shape in the plan view, four intermediate display areas MDA may be provided. In some embodiments, a pixel circuit for driving the pixels PX disposed in the intermediate display area MDA may be included in the main display area FDA, the sub display area SDA, and/or the corner display area CDA adjacent to the intermediate display area MDA.

The corner display area CDA may be disposed at a corner side of the display apparatus 1 and may include a curved surface. Here, the corner of the display apparatus 1 may be a portion where a short side in the first direction (e.g., the x direction or the −x direction) and a long side in the second direction (e.g., the y direction or the −y direction) of the display apparatus 1 meet each other. As illustrated in FIG. 1B, when the display apparatus 1 has a quadrangular (e.g., rectangular) shape in the plan view, four corner display areas CDA may be provided.

The corner display area CDA may be located at a corner side where two edges of the main display area FDA meet each other. That is, the corner display area CDA may be adjacent to two sub display areas SDA. In an embodiment, the corner display area CDA may be located at a corner side where the first edge SD1 and the second edge SD2 of the main display area FDA meet each other and may be adjacent to the first sub display area SDA1 and the second sub display area SDA2.

Because the corner display area CDA is located between adjacent sub display areas SDA having curved surfaces bent in different directions, the corner display area CDA may include a curved surface in which curved surfaces bent in various directions are continuously connected. Also, when the respective curvatures of adjacent sub display areas SDA are different from each other, the curvature of the corner display area CDA may change gradually along the edge of the display apparatus 1. In an embodiment, when the curvature of the first sub display area SDA1 and the curvature of the second sub display area SDA2 are different from each other, the corner display area CDA between the first sub display area SDA1 and the second sub display area SDA2 may have a curvature that changes gradually according to positions, for example.

Although the first sub display area SDA1 and the second sub display area SDA2 and the corner display area CDA therebetween are described in an embodiment, the disclosure may also be similarly applied to the other three corner display areas CDA.

The display apparatus 1 of FIG. 1B may display an image in the corner display area CDA as well as in the main display area FDA, the sub display area SDA, and the intermediate display area MDA. Thus, the percentage of the display area DA in the display apparatus 1 may further increase. That is, in the display apparatus 1 having the same size, the area of the non-display area NDA may decrease and the area of the display area DA may increase. Also, the display apparatus 1 may include the corner display area CDA that includes a rounded curved surface at the corner thereof and displays an image, thereby improving the aesthetic sense.

The non-display area NDA of the display apparatus 1 of FIG. 1B may include a peripheral area PA outside the display area DA. In an embodiment, the peripheral area PA may surround an entirety of the main display area FDA, four sub display areas SDA, and four corner display areas CDA.

Hereinafter, for convenience of description, the display apparatus 1 of FIG. 1B will be described as an example, however, the following descriptions may also be similarly applied to the display apparatus 1 of FIG. 1A.

Figure 2:
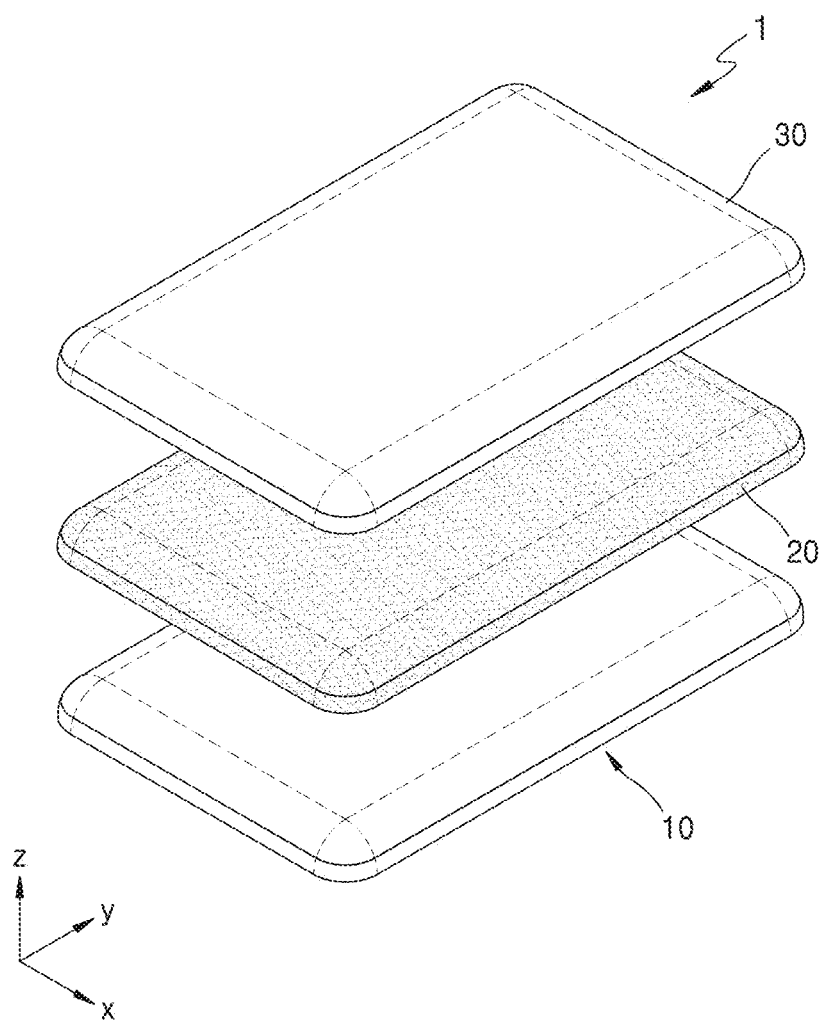
FIG. 2 is an exploded perspective view schematically illustrating another embodiment of a display apparatus.

FIG. 2 is an exploded perspective view schematically illustrating an embodiment of a display apparatus.

Referring to FIG. 2, the display apparatus 1 may include a second protection member 10, a display panel 20, and a cover window 30. The cover window 30 may be disposed on the front surface of the display panel 20. Here, the 'front surface' of the display panel 20 may be defined as a surface facing a direction in which the display panel 20 provides an image.

In an embodiment, the cover window 30 may cover the front surface of the display panel 20. The cover window 30 may protect the front surface of the display panel 20. Also, the cover window 30 may form the external appearance of the display apparatus 1 and thus may include a flat surface and a curved surface corresponding to the shape of the display apparatus 1.

The cover window 30 may be attached to the display panel 20 by an adhesive layer (not illustrated). The adhesive layer may include, for example, an adhesive such as an optical clear adhesive ("OCA") or a pressure sensitive adhesive ("PSA").

The cover window 30 may have a high transmittance to transmit light emitted from the display panel 20 and may have a small thickness to minimize the weight of the display apparatus 1. Also, the cover window 30 may have high rigidity and hardness to protect the display panel 20 from an external impact. In an embodiment, the cover window 30 may be a flexible window, for example. The cover window 30 may protect the display panel 20 while being easily curved according to an external force without generating a crack or the like. In another embodiment, the cover window 30 may include glass, sapphire, or plastic. In an embodiment, the cover window 30 may include ultra-thin glass (UTG®) whose rigidity is reinforced by a method such as chemical reinforcement or thermal reinforcement, for example. In another embodiment, the cover window 30 may include colorless polyimide ("CPI"). In an embodiment, the cover window 30 may have a structure in which a flexible polymer layer is disposed on one surface of a glass substrate or may include only a polymer layer.

The image implemented on the display panel 20 may be provided to the user through the cover window 30 that is transparent. That is, the image provided by the display apparatus 1 may be understood as being implemented by the display panel 20, and thus, the display area DA (refer to FIG. 1A or 1B) and the non-display area NDA (refer to FIG. 1A or 1B) of the display apparatus 1 described above may be understood as being provided in the display panel 20.

The second protection member 10 may be disposed on the rear surface of the display panel 20. That is, the second protection member 10 may be disposed on the other side of the display panel 20 facing one side of the display panel 20 on which the cover window 30 is disposed. In this case, the second protection member 10 may not only protect the display panel 20 from the outside but also absorb the impact applied from the cover window 30 or the like.

Although not illustrated in the drawings, an optical film (not illustrated) may be disposed between the display panel 20 and the cover window 30. Also, a first protection member (not illustrated) may be disposed between the display panel 20 and the second protection member 10.

Figure 3:
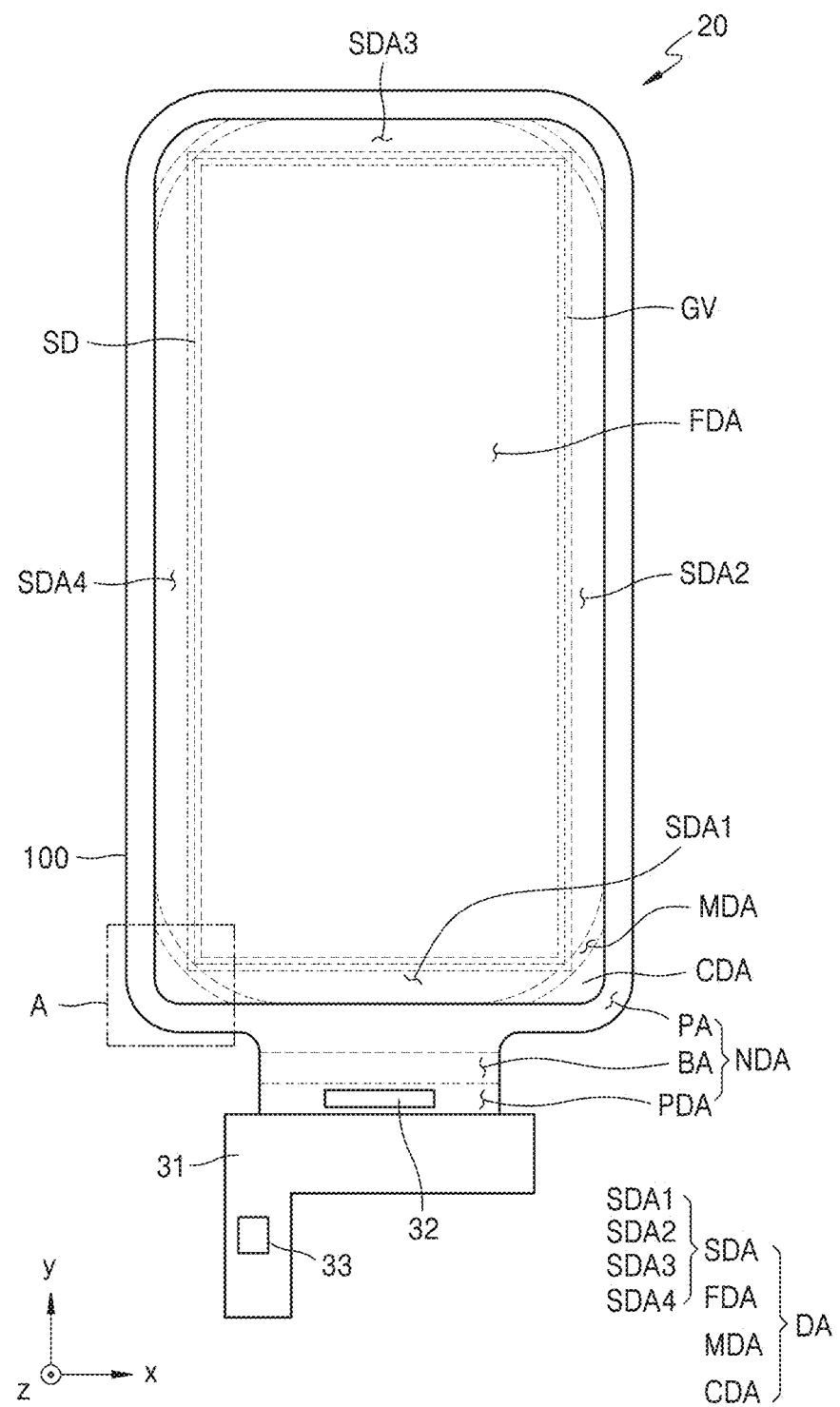
FIG. 3 is a plan view schematically illustrating an embodiment of a portion of a display panel included in a display apparatus.

FIG. 3 is a plan view schematically illustrating an embodiment of a portion of a display panel included in a display apparatus.

Referring to FIG. 3, the display area DA and the non-display area NDA of the display panel 20 may respectively correspond to the display area DA and the non-display area NDA of the display apparatus 1 (refer to FIG. 1A or 1B) described with reference to FIG. 1A or 1B. In an embodiment, the display panel 20 included in the display apparatus 1 (refer to FIG. 1A) illustrated in FIG. 1A may include a display area DA and a non-display area NDA, for example. The display area DA of the display panel 20 may include a main display area FDA, a sub display area SDA, and an intermediate display area MDA. Also, the non-display area NDA of the display panel 20 may include a display panel corner area (not illustrated) corresponding to the display apparatus corner area DCA, a peripheral area PA outside the display area DA, a bending area BA disposed on one side of the peripheral area PA, and a pad area PDA spaced apart from the peripheral area PA with the bending area BA therebetween. In another embodiment, the display panel 20 included in the display apparatus 1 (refer to FIG. 1B) illustrated in FIG. 1B may include a display area DA and a non-display area NDA. The display area DA of the display panel 20 may include a main display area FDA, a sub display area SDA, an intermediate display area MDA, and a corner display area CDA that is a display panel corner area. The non-display area NDA of the display panel 20 may include a peripheral area PA outside the display area DA, a bending area BA disposed on one side of the peripheral area PA, and a pad area PDA spaced apart from the peripheral area PA with the bending area BA therebetween. Moreover, for convenience of description, a case of the display panel 20 included in the display apparatus 1 of FIG. 1B in which the display area DA includes the corner display area CDA and the peripheral area PA surrounds an entirety of the display area DA as illustrated in FIG. 3 will be described below.

In the display panel 20 described above, a bent groove GV may be provided between the main display area FDA and the sub display area SDA and between the main display area FDA and the corner display area CDA. In this case, the bent groove GV may overlap a start point of the sub display area SDA and a start point of the corner display area CDA in the plan view. In this case, the start point of the sub display area SDA and the start point of the corner display area CDA may be a point which is connected to a flat portion and from which a curved surface starts. In an embodiment, in the plan view, an edge SD of the main display area FDA may be disposed inside the bent groove GV, for example.

The bent groove GV described above may be defined in a closed-loop form. In this case, the flat shape of the bent groove GV may be a shape corresponding to the edge of the substrate 100 of the display panel 20. That is, the shortest straight distance from the center of the bent groove GV to the edge of the substrate 100 of the display panel 20 may be constant along the bent groove GV. In another embodiment, the flat shape of the bent groove GV is not limited thereto and may have various shapes.

The bent groove GV described above may overlap the main display area FDA, the sub display area SDA, and the corner display area CDA in the plan view. That is, the width of the bent groove GV may overlap the main display area FDA, the sub display area SDA, and the corner display area CDA.

In an embodiment, the display panel 20 may be bent in the bending area BA such that the display area DA and the pad area PDA may overlap each other in the thickness direction (i.e., the z direction) of the display panel 20. That is, the pad area PDA may be bent to overlap the display area DA on the rear surface of the display panel 20. Accordingly, in the completed display apparatus 1, the area of the non-display area NDA may be reduced and the percentage of the display area DA may be increased.

A display driver 32 and a display circuit board 31 may be arranged in the pad area PDA. The display driver 32 may receive control signals and power voltages and may generate and output signals and voltages for driving the display panel 20. The display driver 32 may include an integrated circuit ("IC").

The display circuit board 31 may be electrically connected to the display panel 20. In an embodiment, although not illustrated in FIG. 3, the display circuit board 31 may be electrically connected through an anisotropic conductive film to a pad portion (not illustrated) disposed in the pad area PDA, for example.

The display circuit board 31 may be a flexible printed circuit board ("FPCB") that may be bent or a rigid printed circuit board ("PCB") that is rigid and is not easily bent, and in some cases, the display circuit board 31 may be a composite PCB including both a rigid PCB and an FPCB.

A sensor driver 33 may be disposed on the display circuit board 31. The sensor driver 33 may include an integrated circuit. The sensor driver 33 may be attached or embedded on the display circuit board 31. The sensor driver 33 may be electrically connected to sensing electrodes of a touch sensing layer of the display panel 20 through the display circuit board 31.

Also, a power supply (not illustrated) or the like for supplying voltages for driving the pixel circuits of the display panel 20, a scan driver, and the display driver 32 may be additionally arranged on the display circuit board 31. In some embodiments, the power supply may be integrated with the display driver 32, and in this case, the display driver 32 and the power supply may be implemented as a single IC.

Also, the display circuit board 31 may be electrically connected to a main circuit board (not illustrated). The main circuit board may include a main processor including a central processing unit ("CPU"), a graphics processing unit ("GPU"), a memory, a communication chip, a digital signal processor ("DSP"), an image signal processor ("ISP"), and/or various types of interfaces, for example, an application processor ("AP").

Moreover, the display panel 20 may include a substrate 100, and various components constituting the display panel 20 may be arranged on the substrate 100. In an embodiment, a plurality of light-emitting devices constituting the display area DA, pixel circuits for driving the respective light-emitting devices, signal lines and/or voltage lines for providing electrical signals and/or voltages to each pixel circuit, driving circuits, and/or the like may be arranged on the substrate 100, for example. The display driver 32 and the display circuit board 31 described above may also be arranged on the substrate 100. In an embodiment, the display driver 32 and the display circuit board 31 may be arranged over the substrate 100. In another embodiment, when a line is disposed by drilling a hole in the substrate 100, the display driver 32 and the display circuit board 31 may be arranged under the substrate 100. In an embodiment, the substrate 100 may include a main display area FDA disposed at a center thereof; a plurality of sub display areas SDA disposed at outside of the main display area FDA; and a display panel corner area disposed between sub display areas SDA of the plurality of sub display areas SDA adjacent to each other and arranged at a corner of the substrate 100. In an embodiment, the display panel corner area may face the curved corner of the cover window 30. In an embodiment, the display elements may be arranged in the main display area FDA, the sub display area SDA, and the display panel corner area to be spaced apart from each other.

Figure 4A:
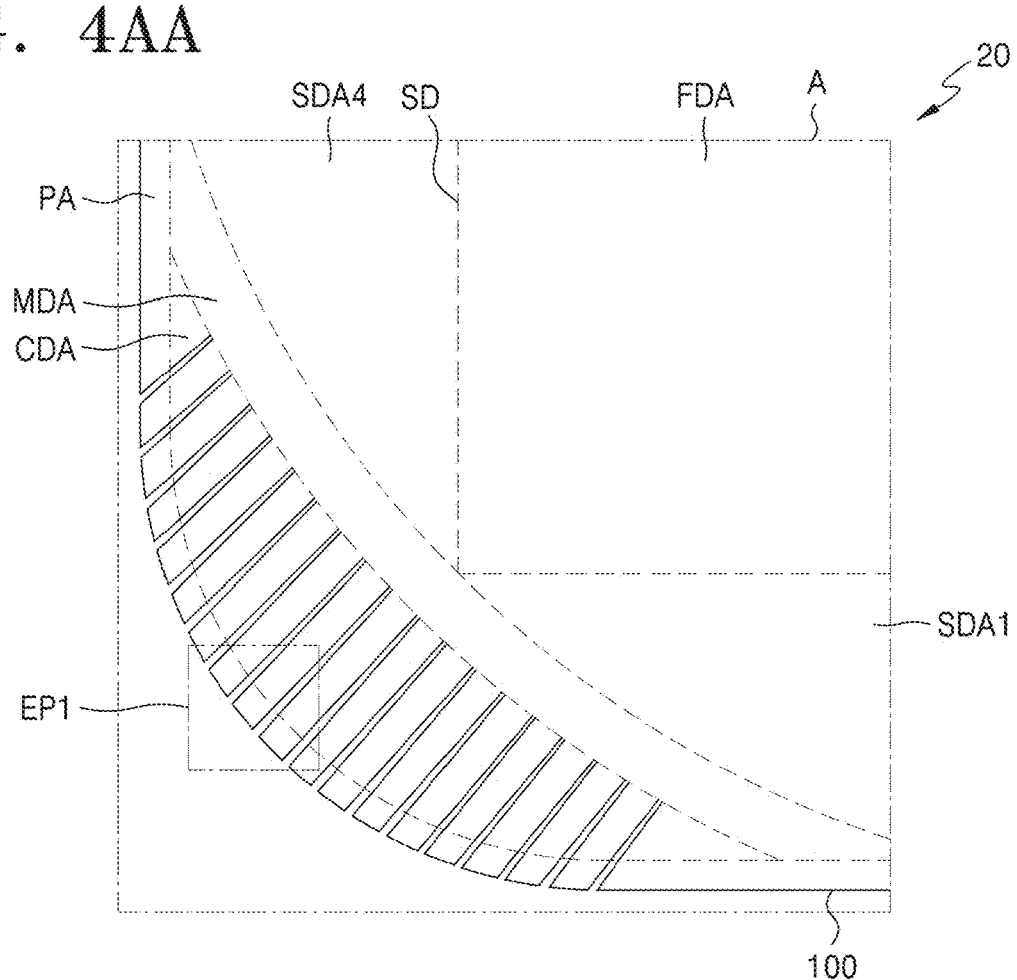
FIGS. 4AA and 4BA are enlarged plan views schematically illustrating embodiments of a portion A of a display panel of FIG. 3, FIG. 4AB is an enlarged plan view of a portion EP1 of FIG. 4AA and FIG. 4BB is an enlarged plan view of a portion EP2 of FIG. 4BA.
Figure 4A:
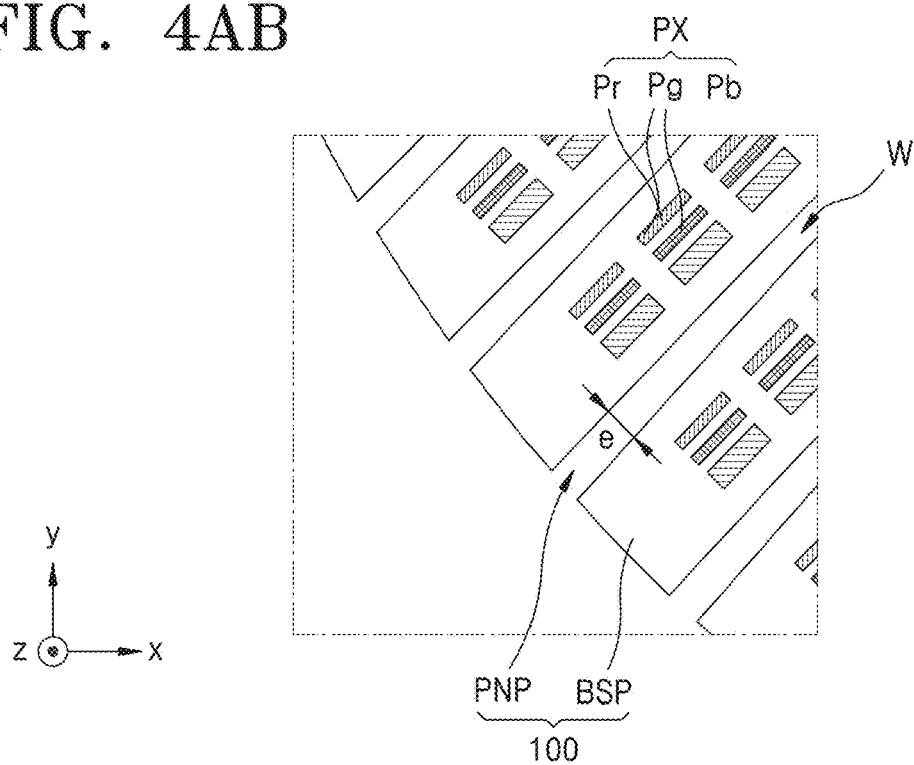
Figure 4B:
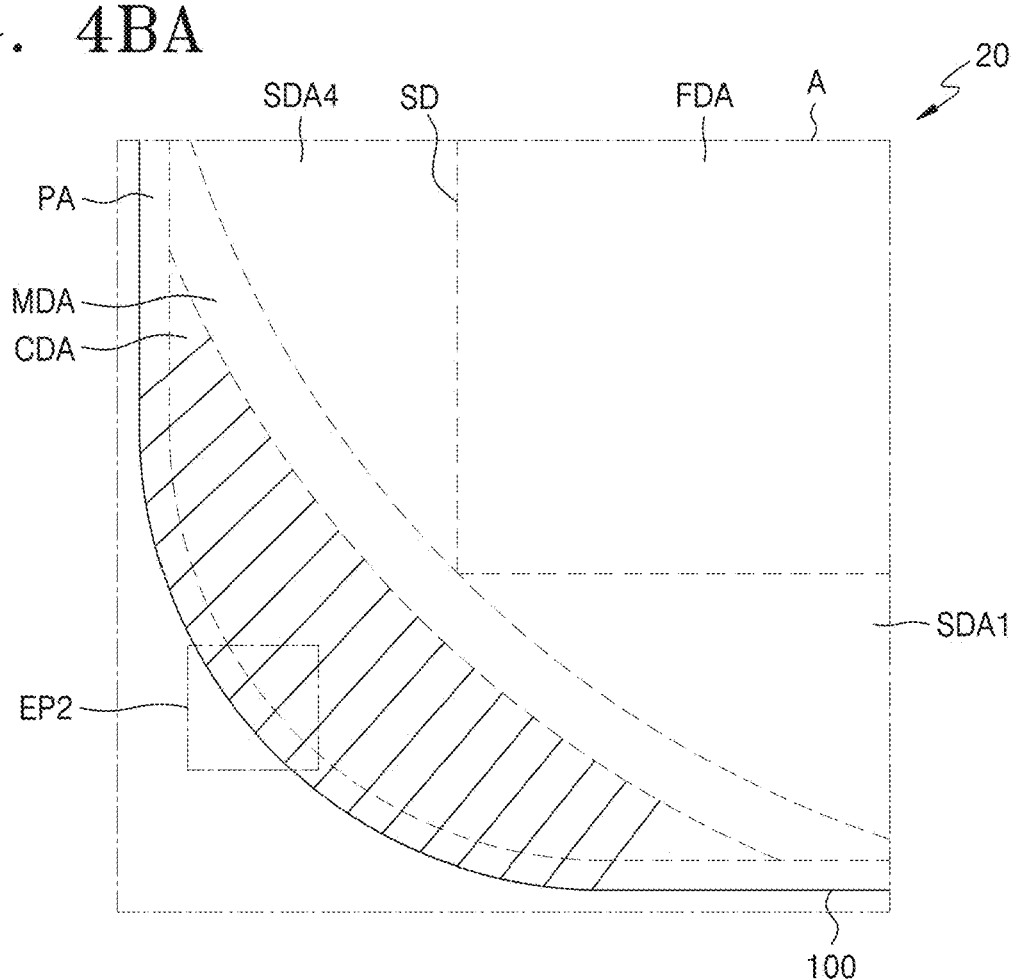
Figure 4B:
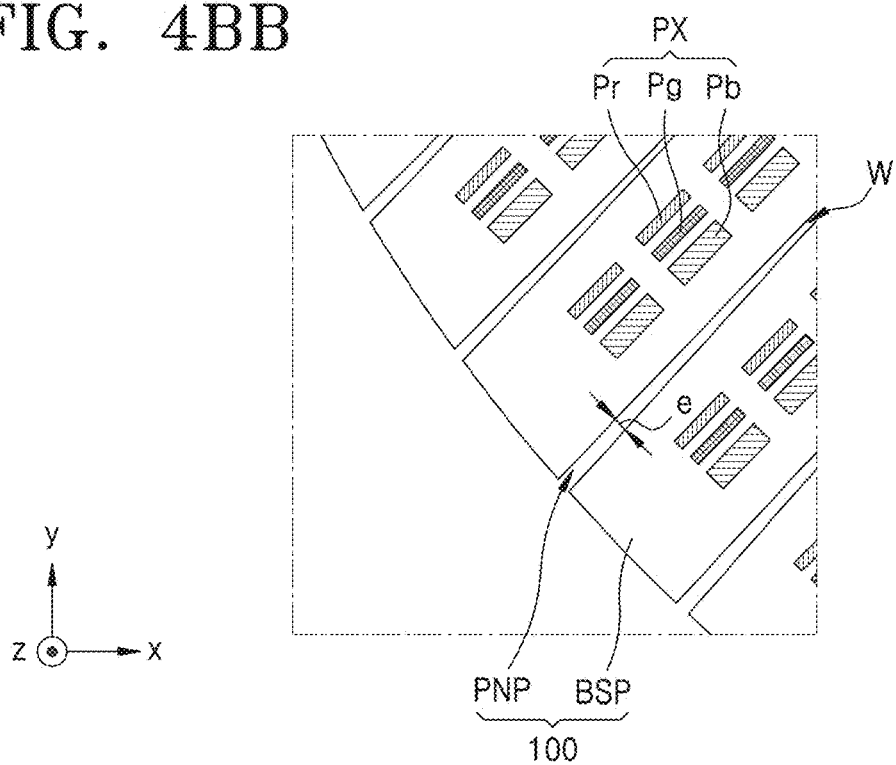

FIGS. 4AA and 4BA are enlarged plan views schematically illustrating embodiments of a portion A of a display panel of FIG. 3, FIG. 4AB is an enlarged plan view of a portion EP1 of FIG. 4AA and FIG. 4BB is an enlarged plan view of a portion EP2 of FIG. 4BA.

Referring to FIGS. 4AA and 4AB, the display panel 20 may include a substrate 100 including a plurality of base portions BSP spaced apart from each other by the plurality of through-portions PNP defined in the substrate 100. In an embodiment, the plurality of through-portions PNP and the plurality of base portions BSP of the substrate 100 may be disposed in the corner display area CDA of the substrate 100 and may extend in an outward direction away from the main display area FDA of the substrate 100.

In an embodiment, each of the plurality of base portions BSP may have a shape extending in an outward direction away from the main display area FDA of the substrate 100, for example. That is, the extension length of the plurality of base portions BSP may be greater than the width in a direction intersecting with the extension direction. One end of the plurality of base portions BSP may be connected to a portion of the substrate 100, and the other end thereof may form a corner of the substrate 100.

The plurality of base portions BSP may be arranged parallel to each other or may be arranged radially. In an embodiment, when the plurality of base portions BSP is arranged parallel to each other, a distance "e" between two adjacent base portions BSP may be constant along the extension direction of the base portion BSP. In an embodiment, when the plurality of base portions BSP is arranged radially, a distance "e" between two adjacent base portions BSP may increase gradually along the extension direction of the base portion BSP. Hereinafter, for convenience of description, a case where a plurality of base portions BSP is radially arranged as illustrated in FIG. 4AB will be described.

Components such as a pixel circuit, a light-emitting device, and/or a signal line may be arranged on a plurality of base portions BSP, and a plurality of pixels PX may be disposed on each of the plurality of base portions BSP. In an embodiment, the plurality of pixels PX may include a red subpixel Pr, a green subpixel Pg, and a blue subpixel Pb. A corner display area CDA may be implemented by the pixels PX on the plurality of base portions BSP.

A through-portion PNP may be defined between two adjacent base portions BSP among the plurality of base portions BSP. The through-portion PNP may be defined by two adjacent base portions BSP and a portion of the substrate 100 connected to the two base portions BSP. The through-portion PNP may extend in the extension direction of the base portion BSP. The through-portion PNP may pass through the upper and lower surfaces of the display panel 20, and the weight of the display panel 20 may be reduced. Due to the through-portion PNP, two adjacent base portions BSP among the plurality of base portions BSP may be spaced apart from each other by a predetermined distance "e". The through-portion PNP may provide a separation area W between two adjacent base portions BSP. That is, each of the through-portions PNP may overlap the separation region W.

Referring to FIGS. 4BA and 4BB, when an external force (e.g., a force such as bending or compressing) is applied to the display panel 20, the positions of the plurality of base portions BSP may change and the shape of the separation region W between two adjacent base portions BSP may change. Accordingly, both shrinkage and elongation characteristics may be assigned to the display panel 20. In an embodiment, each of the base portions BSP may be elongated in the extension direction as an external force is applied to the base portions BSP, and simultaneously, it may have a shrinkage effect as the area of the separation area W between two adjacent base portions BSP decreases, for example. Also, in some embodiments, each of the base portions BSP may be bent by a different curvature.

Through the structure of the substrate 100, it may be possible to prevent damage to the components arranged on the corner display areas CDA of the substrate 100 even when the corner display areas CDA of the substrate 100 are bent. Because the components may be arranged without damage in the corner display areas CDA of the substrate 100, the pixels PX may be stably formed or provided in the corner display areas CDA. Thus, the corner display area CDA of the display apparatus 1 may be implemented, and accordingly, the display area DA of the display apparatus 1 may be expanded.

Figure 5:
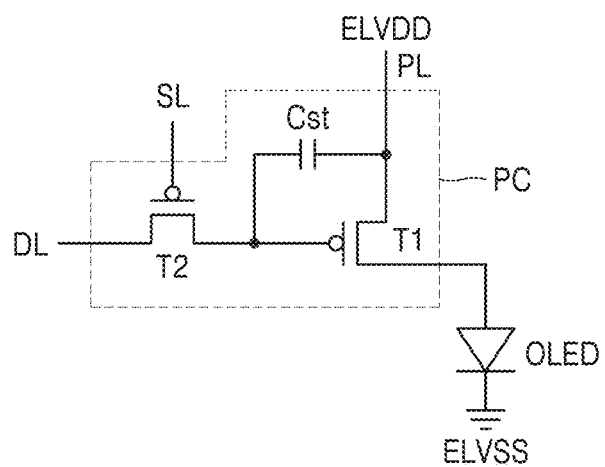
FIG. 5 is an equivalent circuit diagram of an embodiment of a pixel circuit included in a display apparatus according to the invention.

FIG. 5 is an equivalent circuit diagram of an embodiment of a pixel circuit included in a display apparatus according to the invention.

Referring to FIG. 5, a pixel circuit PC may include a plurality of thin film transistors TFT (refer to FIGS. 9A to 9D) and a storage capacitor Cst and may be electrically connected to an organic light-emitting diode OLED. In an embodiment, the pixel circuit PC may include a driving thin film transistor T1, a switching thin film transistor T2, and a storage capacitor Cst.

The switching thin film transistor T2 may be connected to a scan line SL and a data line DL and may transmit a data voltage or a data signal input from the data line DL to the driving thin film transistor T1 according to a switching voltage or a scan signal input from the scan line SL. The storage capacitor Cst may be connected to the switching thin film transistor T2 and a driving voltage line PL and may store a voltage corresponding to the difference between a voltage received from the switching thin film transistor T2 and a first power voltage ELVDD supplied to the driving voltage line PL.

The driving thin film transistor T1 may be connected to the driving voltage line PL and the storage capacitor Cst and may control a driving current flowing from the driving voltage line PL through the organic light-emitting diode OLED in response to a voltage value stored in the storage capacitor Cst. An opposite electrode (e.g., a cathode) of the organic light-emitting diode OLED may be supplied with a second power voltage ELVSS. The organic light-emitting diode OLED may emit light with a predetermined brightness according to the driving current.

Although a case where the pixel circuit PC includes two thin film transistors and one storage capacitor has been described above, the invention is not limited thereto. In an embodiment, the pixel circuit PC may include three or more thin film transistors and/or two or more storage capacitors, for example. In an embodiment, the pixel circuit PC may include seven thin film transistors and one storage capacitor. The number of thin film transistors and the number of storage capacitors may be variously modified according to the design of the pixel circuit PC. However, hereinafter, for convenience of description, a case where the pixel circuit PC includes two thin film transistors and one storage capacitor will be described.

Figure 6A:
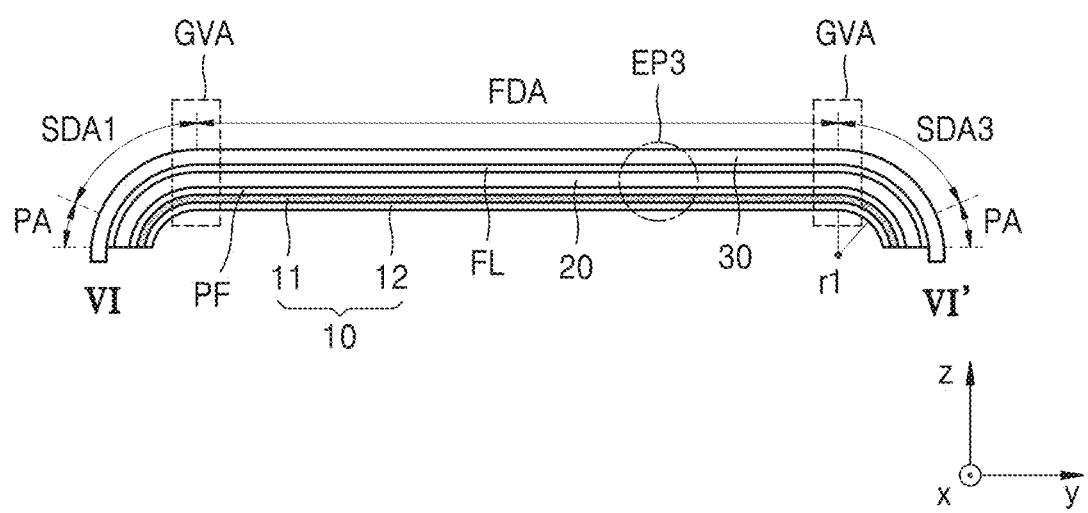
FIG. 6A is a cross-sectional view of a portion of the display apparatus of FIG. 1A or 1B taken along line VI-VI'.
Figure 6B:
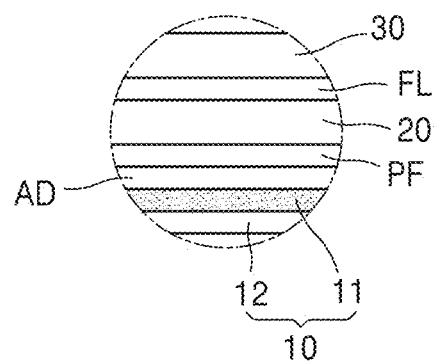
FIG. 6B is an enlarged view of a portion EP3 of FIG. 6A.
Figure 7:
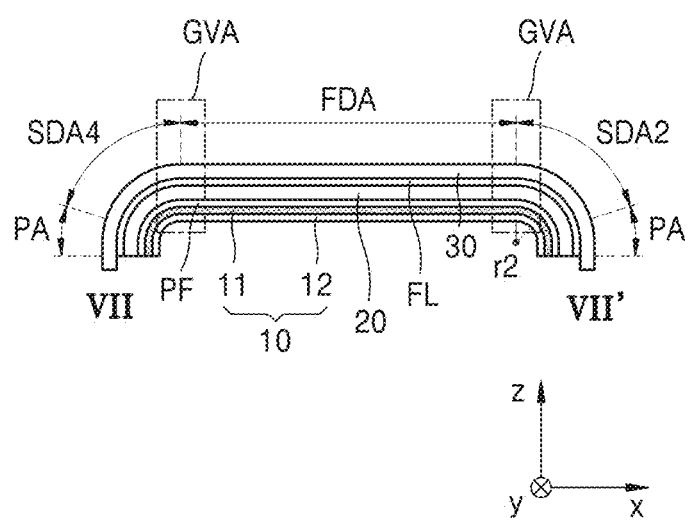
FIG. 7 is a cross-sectional view of a portion of the display apparatus of FIG. 1A or 1B taken along line VII-VII'.
Figure 8:
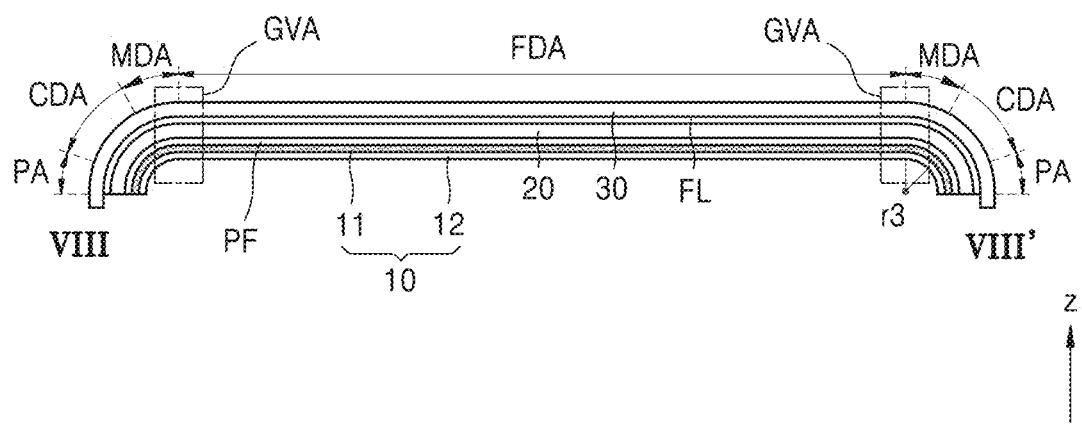
FIG. 8 is a cross-sectional view of a portion of the display apparatus of FIG. 1A or 1B taken along line VIII-VIII'.

FIG. 6A is a cross-sectional view of a portion of the display apparatus of FIG. 1A or 1B taken along line VI-VI', and FIG. 6B is an enlarged view of a portion EP3 of FIG. 6A. FIG. 7 is a cross-sectional view of a portion of the display apparatus of FIG. 1A or 1B taken along line VII-VII'. FIG. 8 is a cross-sectional view of a portion of the display apparatus of FIG. 1A or 1B taken along line VIII-VIII'.

Referring to FIGS. 6A to 8, the display apparatus 1 may include a second protection member 10, a display panel 20, and a cover window 30. In this case, because the display panel 20 and the cover window 30 are the same as or similar to those described above, redundant descriptions thereof will be omitted for conciseness.

An upper member FL may be attached through an adhesive member to the front surface of the display panel 20 in the form of a film. A general one known in the art may be used without limitation as the adhesive member, and for example, the adhesive member may include an OCA or a PSA.

In an embodiment, the upper member FL may be a functional layer that may reduce the reflectance of light (external light) incident from the outside toward the display panel 20 and/or improve the color purity of light emitted from the display panel 20. In this case, the upper member FL may be a polarization film including a phase retarder and/or a polarizer. The phase retarder may include a $\lambda/2$ phase retarder and/or a $\lambda/4$ phase retarder.

The second protection member 10 and the cover window 30 may protect the display panel 20.

The display panel 20 may be disposed under the cover window 30. The display area DA of the display panel 20 may include the main display area FDA, the sub display area SDA, and the intermediate display area MDA as described with reference to FIG. 1A. In another embodiment, the display area DA of the display panel 20 may include the main display area FDA, the sub display area SDA, the corner display area CDA, and the intermediate display area MDA as described with reference to FIG. 1B. Hereinafter, for convenience of description, a case where the display area DA includes the main display area FDA, the sub display area SDA, the corner display area CDA, and the intermediate display area MDA will be described in detail.

The first sub display area SDA1 and the third sub display area SDA3 may be connected to the main display area FDA in the first direction (e.g., the ±y direction). In an embodiment, the first sub display area SDA1 may be connected in the −y direction from the main display area FDA, and the third sub display area SDA3 may be connected in the +y direction from the main display area FDA, for example. The first sub display area SDA1 may be connected to the first edge SD1 of the main display area FDA, and the third sub display area SDA3 may be connected to the third edge SD3 of the main display area FDA.

The first sub display area SDA1 and the third sub display area SDA3 may be bent with a predetermined curvature radius. In an embodiment, the curvature radius of the first sub display area SDA1 and the curvature radius of the third sub display area SDA3 may be different from each other, for example. In another embodiment, the curvature radius of the first sub display area SDA1 and the curvature radius of the third sub display area SDA3 may be equal to each other. Hereinafter, a case where the first sub display area SDA1 and the third sub display area SDA3 have the same curvature radius as a first curvature radius r1 will be mainly described in detail. Also, because the first sub display area SDA1 and the third sub display area SDA3 are similar to each other, the first sub display area SDA1 will be mainly described in detail.

The second sub display area SDA2 and the fourth sub display area SDA4 may be connected to the main display area FDA in the second direction (e.g., the ±x direction). In an embodiment, the second sub display area SDA2 may be connected in the +x direction from the main display area FDA, and the fourth sub display area SDA4 may be connected in the −x direction from the main display area FDA, for example. The second sub display area SDA2 may be connected to the second edge SD2 of the main display area FDA, and the fourth sub display area SDA4 may be connected to the fourth edge SD4 of the main display area FDA.

The second sub display area SDA2 and the fourth sub display area SDA4 may be bent with a predetermined curvature radius. In an embodiment, the curvature radius of the second sub display area SDA2 and the curvature radius of the fourth sub display area SDA4 may be different from each other, for example. In another embodiment, the curvature radius of the second sub display area SDA2 and the curvature radius of the fourth sub display area SDA4 may be equal to each other. Hereinafter, a case where the second sub display area SDA2 and the fourth sub display area SDA4 have the same curvature radius as a second curvature radius $r2$ will be mainly described in detail. Also, because the second sub display area SDA2 and the fourth sub display area SDA4 are similar to each other, the second sub display area SDA2 will be mainly described in detail.

In an embodiment, the first curvature radius $r1$ of the first sub display area SDA1 may be different from the second curvature radius $r2$ of the second sub display area SDA2. In an embodiment, the first curvature radius $r1$ may be less than the second curvature radius $r2$, for example. In another embodiment, the first curvature radius $r1$ may be greater than the second curvature radius $r2$.

In another embodiment, the first curvature radius $r1$ of the first sub display area SDA1 may be equal to the second curvature radius $r2$ of the second sub display area SDA2. Hereinafter, a case where the first curvature radius $r1$ is greater than the second curvature radius $r2$ will be mainly described in detail.

The corner display area CDA and the intermediate display area MDA may extend from a corner of the main display area FDA and may be bent. That is, as described above, the corner display area CDA and the intermediate display area MDA may be a corner of the display area DA and may be a portion where the long side in the first direction (e.g., the ±y direction) and the short side in the second direction (e.g., ±x direction) of the display area DA meet each other.

At least one of the corner display area CDA and the intermediate display area MDA may have a curved shape having a third curvature radius $r3$. In this case, the third curvature radius $r3$ may be constant in the corner display area CDA and the intermediate display area MDA. In another embodiment, the third curvature radius $r3$ of at least one of the corner display area CDA and the intermediate display area MDA may include a plurality of curvature radiuses. The corner display area CDA and the intermediate display area MDA may have a plurality of third curvature radiuses $r3$. In other words, the third curvature radius $r3$ of the corner display area CDA and the intermediate display area MDA may vary. In an embodiment, the plurality of third curvature radiuses $r3$ of the corner display area CDA and the intermediate display area MDA may respectively correspond to predetermined curvature radiuses within a vector sum $(r1+r2)$ of the first curvature radius $r1$ of the first sub display area SDA1 and the second curvature radius $r2$ of the second sub display area SDA2, for example. In other words, the third curvature radius $r3$ may vary within the vector sum $(r1+r2)$ of the first curvature radius $r1$ and the second curvature radius $r2$.

Moreover, the display apparatus 1 may be manufactured by sequentially attaching the display panel 20 and the second protection member 10 to the cover window 30 bent with a preset curvature radius. Thus, although it has been described that the display panel 20 is bent with the first curvature radius $r1$, the second curvature radius $r2$, and the third curvature radius $r3$, the cover window 30 and the second protection member 10 may also be similarly applied.

The second protection member 10 may be disposed under the rear surface of the display panel 20. The second protection member 10 may be disposed on the rear surface (e.g., the +z direction) of the display panel 20. The second protection member 10 may include a first layer 11 and a second layer 12 and may be attached to a lower portion of the display panel 20 through the first layer 11 including an adhesive layer AD.

A first protection member PF may be disposed between the second protection member 10 and the display panel 20 described above. In this case, the first protection member PF may be attached through an adhesive member to the rear surface of the display panel 20 in the form of a film. A general one known in the art may be used without limitation as the adhesive member, and for example, the adhesive member may include an OCA or a PSA.

The first protection member PF described above may have a thickness of about 200 micrometers (μm) to about 270 μm. The first protection member PF may protect the display panel 20 from the outside. In an embodiment, the first protection member PF may absorb a physical impact from the outside and may block foreign substances or moisture from penetrating into the display panel 20, for example. In this case, the first protection member PF may have an elastic modulus of about 70 megapascals (MPa) or less and may include a silicone-based resin. In an embodiment, the first protection member PF may include polydimethylsiloxane ("PDMS"), for example.

FIGS. 9A to 9D are cross-sectional views schematically illustrating an embodiment of a portion of a bending area of a display panel included in a display apparatus.

Referring to FIGS. 9A to 9D, the display panel 20 may include a substrate 100, a pixel circuit layer PCL, a display layer DISL, an encapsulation layer ENL, and a touch sensing layer TSL.

The substrate 100 may include a single layer or a plurality of layers. In an embodiment, when the substrate 100 includes a single layer, the substrate 100 may include polyimide ("PI"), polyethersulphone ("PES"), polyarylate, polyetherimide ("PEI"), polyethylene naphthalate ("PEN"), polyethylene terephthalate ("PET"), polyphenylene sulfide ("PPS"), polycarbonate, cellulose triacetate ("TAC"), and/or cellulose acetate propionate ("CAP"). In another embodiment, the substrate 100 may have a multilayer structure including a base layer including a polymer resin and an inorganic layer. In an embodiment, the substrate 100 may include a base layer including a polymer resin and a barrier layer of an inorganic insulating layer, for example. Hereinafter, for convenience of description, a case where the substrate 100 has a multilayer structure including a base layer including a polymer resin and an inorganic layer will be mainly described in detail.

The substrate 100 may include a first base layer 101, a first barrier layer 102, a second base layer 103, and a second barrier layer 104 that are sequentially stacked. The first base layer 101 and the second base layer 103 may include PI, PES, PEI, PEN, PET, PPS, PC, TAC, and/or CAP. The first barrier layer 102 and the second barrier layer 104 may include an inorganic insulating material such as silicon oxide, silicon oxynitride, and silicon nitride. The substrate 100 may have flexible characteristics.

A bent groove GV may be defined in the substrate 100 described above. In this case, the bent groove GV may be defined in a bending area GVA illustrated in FIGS. 6A to 8. The bending area GVA may include a point where bending starts and may include part of at least two of the main display area FDA, the sub display area SDA, the corner display area CDA, and the intermediate display area MDA. Particularly, the first edge SD1, the second edge SD2, the third edge SD3, and the fourth edge SD4 illustrated in FIGS. 1A and 1B may be arranged inside the bending area GVA in the plan view.

The bent groove GV described above may be formed in at least a portion of the substrate 100. In an embodiment, the bent groove GV may be formed in the first base layer 101, for example. In this case, the bent groove GV may have a shape in which at least a portion of the first base layer 101 is removed or an entirety of the first base layer 101 is removed. In another embodiment, the bent groove GV may be formed by removing at least a portion of the first base layer 101, the first barrier layer 102, and the second base layer 103. Hereinafter, for convenience of description, a case where the bent groove GV is formed by removing only a portion of the first base layer 101 will be mainly described in detail.

Figure 9A:
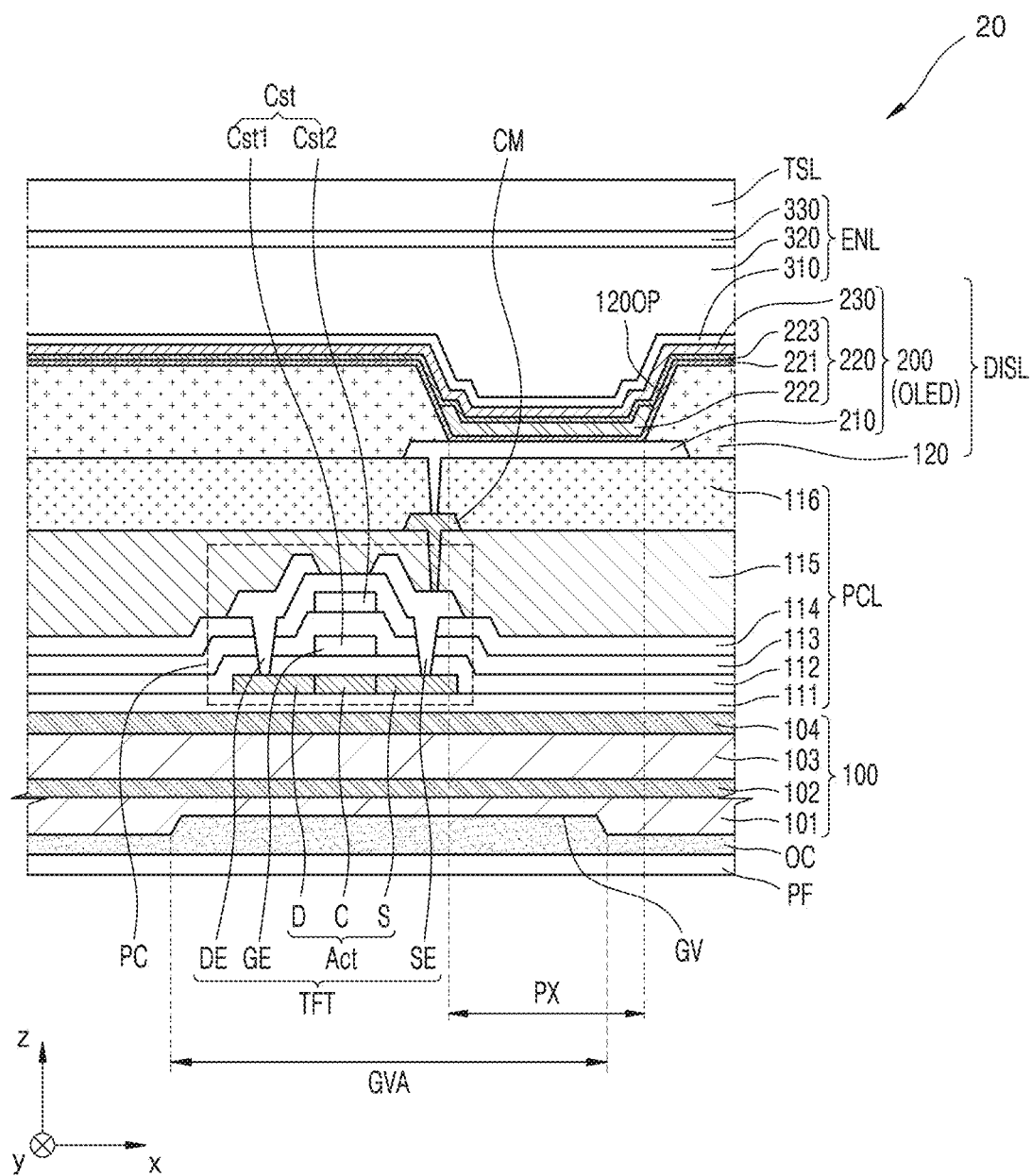
FIGS. 9A to 9D are cross-sectional views schematically illustrating an embodiment of a portion of a bending area of a display panel included in a display apparatus.
Figure 9B:
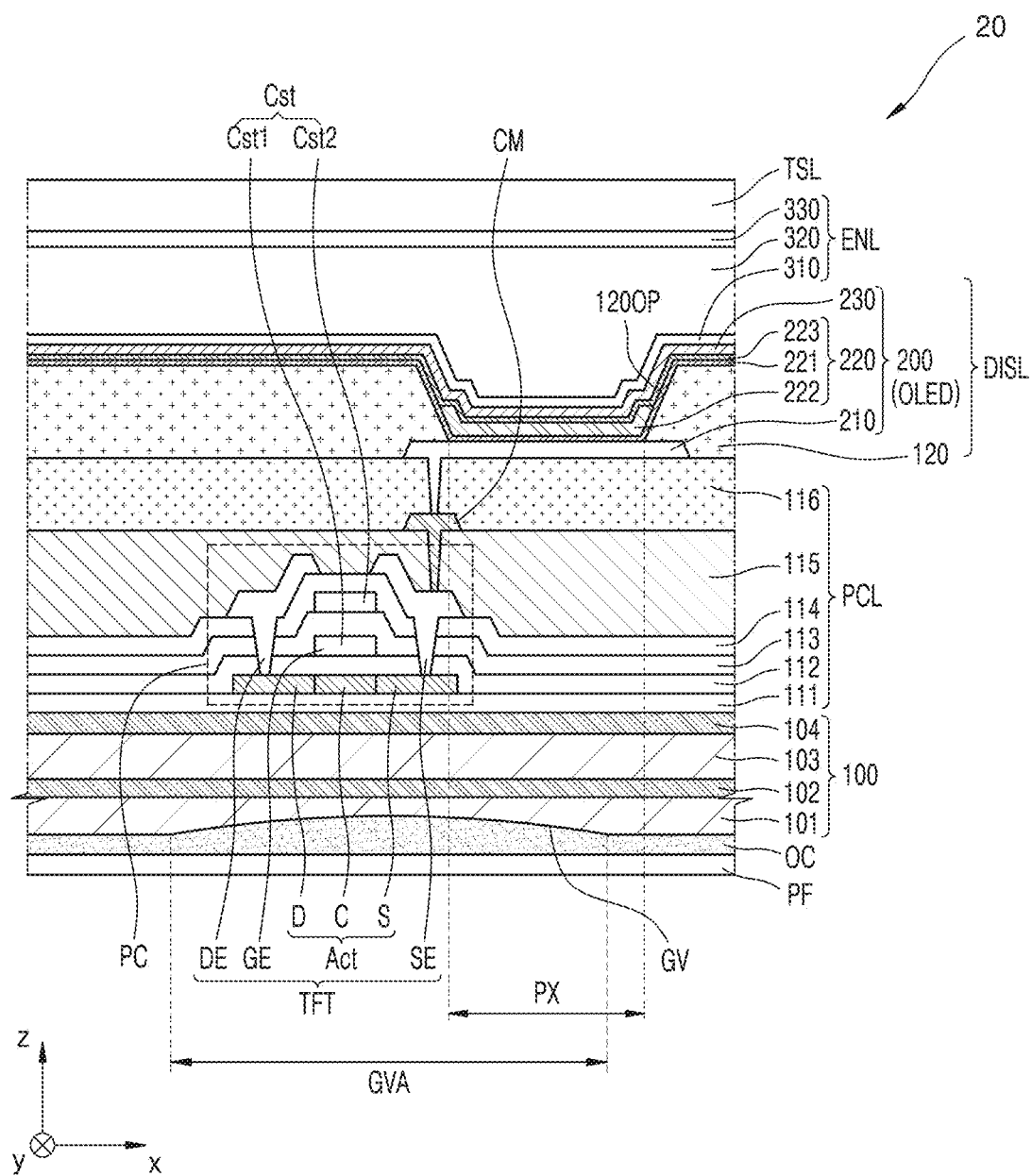
Figure 9C:
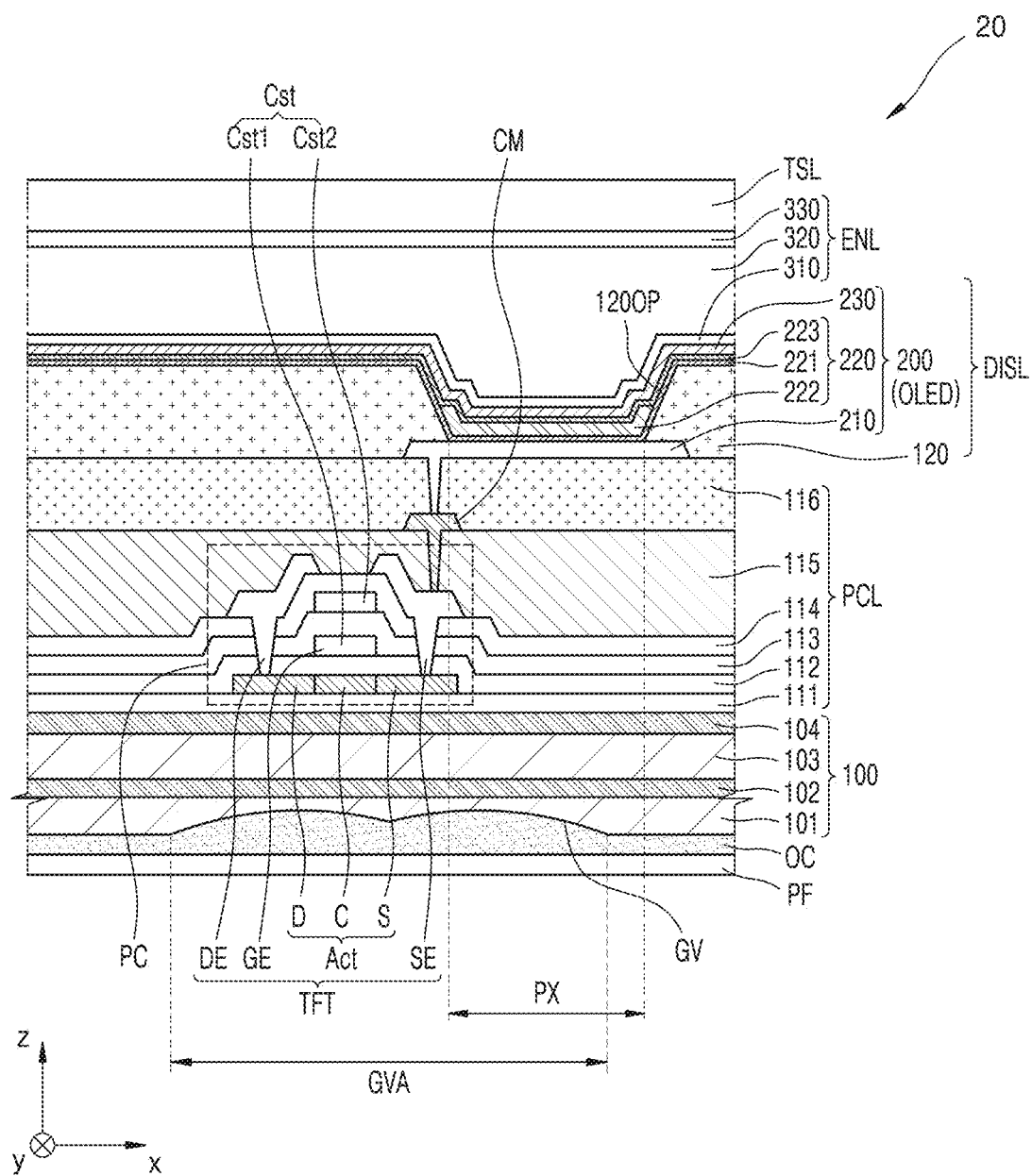
Figure 9D:
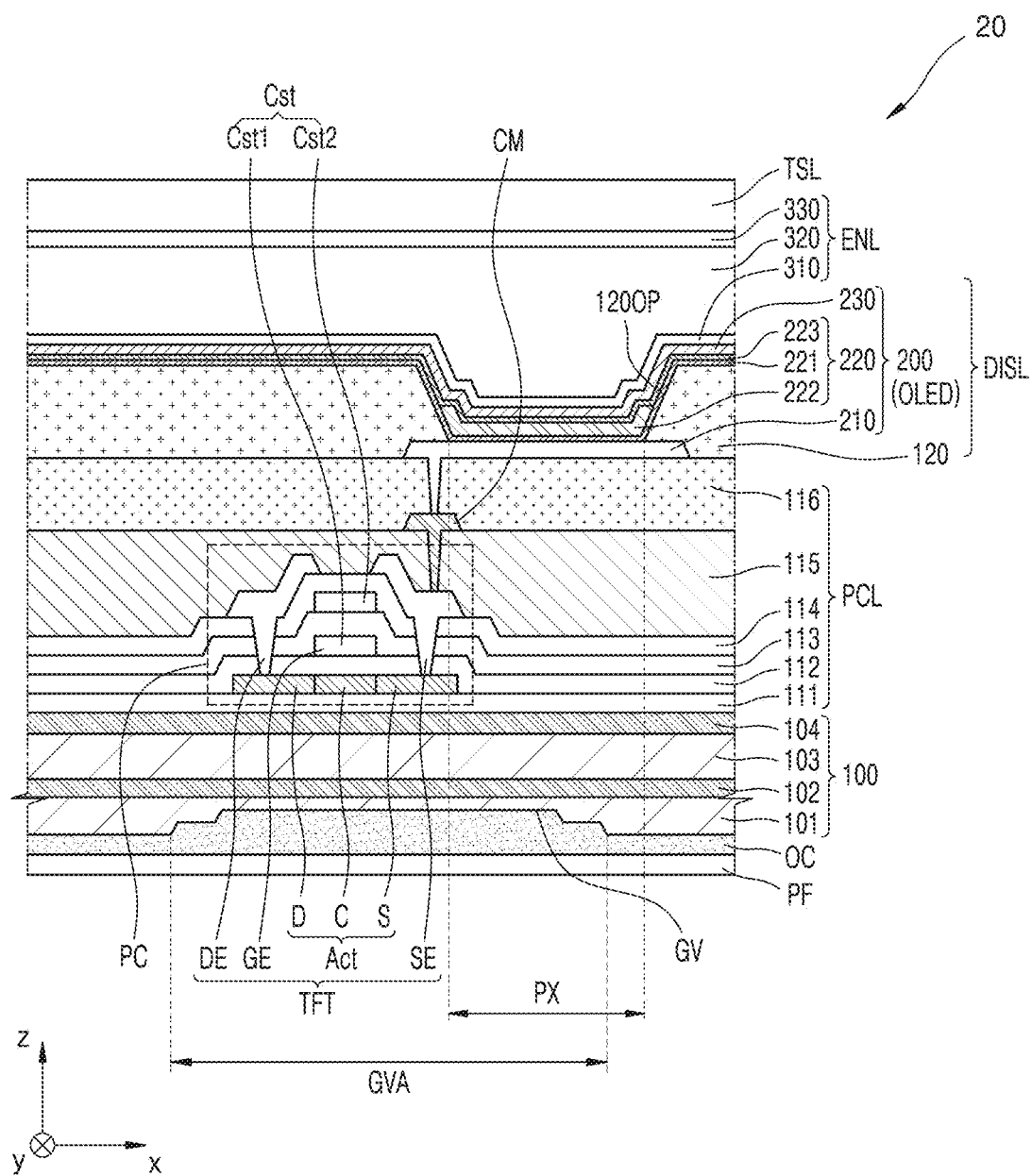

The cross-sectional shape of the bent groove GV described above may be variously formed. As illustrated in FIG. 9A, in an embodiment, the edge of the inner surface of the bent groove GV may be inclined, and the center portion of the bent groove GV may be flat, for example. In another embodiment, as illustrated in FIG. 9B, the inner surface of the bent groove GV may be rounded. In this case, the edge of the bent groove GV may also be rounded or may be naturally connected to the lower surface of the first base layer 101. In another embodiment, as illustrated in FIG. 9C, the bent groove GV may be formed such that a plurality of curved surfaces may at least partially overlap each other. That is, a plurality of bent grooves GV having a rounded inner surface may be provided, and the plurality of bent grooves GV may partially overlap each other. In this case, as illustrated in FIG. 9C, a protrusion portion may be disposed at the center portion of the bent groove GV. In another embodiment, as illustrated in FIG. 9D, the edge of the inner surface of the bent groove GV may be stepped. In this case, the central portion of the bent groove GV may be flat. In another embodiment, the bent groove GV may be formed in a concave-convex shape although not illustrated in the drawings. In another embodiment, the edge of the bent groove GV may be rounded as illustrated in FIG. 9B or 9C, and the center portion of the bent groove GV may be flat as illustrated in FIG. 9A or 9D. In another embodiment, the edge of the bent groove GV may be inclined as illustrated in FIG. 9A or may be stepped as illustrated in FIG. 9D, and the center portion of the inner surface of the bent groove GV may have a shape illustrated in FIG. 9B or 9C. In another embodiment, although not illustrated in the drawings, the edge of the bent groove GV may be stepped as illustrated in FIG. 9D and the boundary of the stepped portion may be rounded. In the above case, the shape of the bent groove GV is not limited thereto, and the thickness of a portion of the substrate 100 where the bent groove GV is defined may be less the thickness of another portion of the substrate 100 where the bent groove GV is not defined. In this case, the thickness of the substrate 100 may be measured as a distance from one surface of the substrate 100 to the other surface of the substrate 100 in the z-axis direction of FIGS. 9A to 9D.

When the bent groove GV is defined as described above, the elastic modulus of a portion of the substrate 100 where the bent groove GV is defined may be less than the elastic modulus of another portion of the substrate 100 where the bent groove GV is not defined. In this case, the substrate 100 may be easily modified based on the bent groove GV, and the substrate 100 may be bent with a small force. Particularly, when the bent groove GV is defined, because a portion of the substrate 100 where the bent grooves GV is defined may have a smaller restoration force to return to the flat state from the bent state of the substrate 100, the bent shape of the side and the corner of the display panel 20 may be maintained for a long time. Also, when the display panel 20 is bent and attached to the cover window 30, the display panel 20 may be easily modified.

The bent groove GV described above may be defined in various ways. In an embodiment, the bent groove GV may be defined by a laser. In this case, the bent groove GV having a cross-sectional shape illustrated in FIGS. 9A to 9D may be defined while the laser is moved in one direction (e.g., the x-axis direction of FIGS. 9A to 9D), for example. Also, the bent groove GV having the shape illustrated in FIG. 3 may be defined while linearly moving the laser in one direction (e.g., the x-axis direction of FIGS. 9A to 9D) and another direction (e.g., the y-axis direction of FIGS. 9A to 9D). In another embodiment, the bent groove GV may be defined by performing etching by atmospheric pressure plasma.

The bent groove GV described above may be defined by supplying a laser or atmospheric pressure plasma to the lower surface of the substrate 100 after manufacturing the substrate 100. In another embodiment, the bent groove GV may be defined by forming each layer on the substrate 100 and forming a touch sensing layer TSL described below and then supplying a laser or atmospheric pressure plasma to the rear surface of the display panel 20. In another embodiment, the bent groove GV may be defined by forming an encapsulation layer ENL described below on the substrate 100 and supplying a laser or atmospheric pressure plasma to the rear surface of the display panel 20 before forming the touch sensing layer TSL. Hereinafter, for convenience of description, a case where the bent groove GV is defined by supplying a laser or atmospheric pressure plasma to the rear surface of the display panel 20 after forming the touch sensing layer TSL will be mainly described in detail.

The pixel circuit layer PCL may be disposed on the substrate 100. The pixel circuit layer PCL may include a pixel circuit PC including a thin film transistor TFT and a storage capacitor Cst. Also, the pixel circuit layer PCL may include a buffer layer 111, a first gate insulating layer 112, a second gate insulating layer 113, an inter-insulating layer 114, a first planarization layer 115, and a second planarization layer 116 arranged under and/or over the components of the pixel circuit PC.

The buffer layer 111 may reduce or block the penetration of foreign materials, moisture, or external air from under the substrate 100 and may provide a flat surface on the substrate 100. The buffer layer 111 may include an inorganic insulating material such as silicon oxide, silicon oxynitride, or silicon nitride and may be formed or provided in a single-layer or multiple-layer structure including the above material.

The thin film transistor TFT on the buffer layer 111 may include a semiconductor layer Act, and the semiconductor layer Act may include polysilicon. In an alternative embodiment, the semiconductor layer Act may include amorphous silicon, may include an oxide semiconductor, or may include an organic semiconductor or the like. The semiconductor layer Act may include a channel area C and a source area S and a drain area D respectively arranged on both sides of the channel area C. A gate electrode GE may overlap the channel area C.

The gate electrode GE may include a low-resistance metal material. The gate electrode GE may include a conductive material including molybdenum (Mo), aluminum (Al), copper (Cu), titanium (Ti), or the like and may include a single layer or multiple layers including the above material.

The first gate insulating layer 112 between the semiconductor layer Act and the gate electrode GE may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc Oxide ($ZnO_x$) may be ZnO, and/or $ZnO_2$.

The second gate insulating layer 113 may cover the gate electrode GE. Like the first gate insulating layer 112, the second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc Oxide ($ZnO_x$) may be ZnO, and/or $ZnO_2$.

An upper electrode Cst2 of the storage capacitor Cst may be disposed over the second gate insulating layer 113. The upper electrode Cst2 may overlap the gate electrode GE thereunder. In this case, the gate electrode GE and the upper electrode Cst2 overlapping each other with the second gate insulating layer 113 therebetween may form the storage capacitor Cst. That is, the gate electrode GE may function as a lower electrode Cst1 of the storage capacitor Cst.

As such, the storage capacitor Cst and the thin film transistor TFT may overlap each other. In some embodiments, the storage capacitor Cst may not overlap the thin film transistor TFT.

The upper electrodes Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may include a single layer or multiple layers of the above material.

The inter-insulating layer 114 may cover the upper electrode Cst2. The inter-insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc Oxide ($ZnO_x$) may be ZnO, and/or $ZnO_2$. The inter-insulating layer 114 may include a single layer or multiple layers including the above inorganic insulating material.

Each of a drain electrode DE and a source electrode SE may be disposed on the inter-insulating layer 114. The drain electrode DE and the source electrode SE may be respectively connected to the drain area D and the source area S through contact holes of insulating layers thereunder. The drain electrode DE and the source electrode SE may include a material having high conductivity. The drain electrode DE and the source electrode SE may include a conductive material including molybdenum (Mo), aluminum (Al), copper (Cu), titanium (Ti), or the like and may include a single layer or multiple layers including the above material. In an embodiment, the drain electrode DE and the source electrode SE may have a multilayer structure of Ti/Al/Ti.

The first planarization layer 115 may cover the drain electrode DE and the source electrode SE. The first planarization layer 115 may include an organic insulating material such as a general-purpose polymer such as polymethylmethacrylate ("PMMA") or polystyrene ("PS"), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or any combination thereof.

The second planarization layer 116 may be disposed on the first planarization layer 115. The second planarization layer 116 may include the same material as that of the first planarization layer 115 and may include an organic insulating material such as a general-purpose polymer such as polymethylmethacrylate ("PMMA") or polystyrene ("PS"), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or any combination thereof.

The display layer DISL may be disposed on the pixel circuit layer PCL having the above structure. The display layer DISL may include a light-emitting device 200 and a pixel definition layer 120. The light-emitting device 200 may include, for example, an organic light-emitting diode OLED, and the organic light-emitting diode OLED may include a stack structure of a pixel electrode 210, an intermediate layer 220, and an opposite electrode 230. In an embodiment, the organic light-emitting diode OLED may emit red, green, or blue light or may emit red, green, blue, or white light. The organic light-emitting diode OLED may emit light through an emission area, and the emission area may be defined as a pixel PX, for example.

The pixel electrode 210 may be disposed on the second planarization layer 116. The pixel electrode 210 may be connected to a contact metal CM disposed on the first planarization layer 115 through a contact hole defined in the second planarization layer 116 and the contact metal CM may be electrically connected to the thin film transistor TFT through a contact hole defined in the first planarization layer 115.

The pixel electrode 210 may include a conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In another embodiment, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any combination thereof. In another embodiment, the pixel electrode 210 may further include a layer including ITO, IZO, ZnO, or $In_2O_3$ over/under the reflective layer.

The pixel definition layer 120 in which an opening 120OP exposing a center portion of the pixel electrode 210 is defined may be disposed on the pixel electrode 210. The pixel definition layer 120 may include an organic insulating material and/or an inorganic insulating material. The opening 120OP may define an emission area of light emitted from the light-emitting device 200. In an embodiment, the size/width of the opening 120OP may correspond to the size/width of the emission area, for example. Thus, the size and/or width of the pixel PX may depend on the size and/or width of the opening 120OP of the pixel definition layer 120 corresponding thereto.

The intermediate layer 220 may include an emission layer 222 corresponding to the pixel electrode 210. The emission layer 222 may include a high-molecular or low-molecular weight organic material for emitting light of a predetermined color. In an alternative embodiment, the emission layer 222 may include an inorganic light-emitting material or may include quantum dots.

A first functional layer 221 and a second functional layer 223 may be arranged under and over the emission layer 222. The first functional layer 221 may include, for example, a hole transport layer ("HTL") or may include an HTL and a hole injection layer ("HIL"). The second functional layer 223 may be a component disposed on the emission layer 222 and may include an electron transport layer ("ETL") and/or an electron injection layer ("EIL"). Like the opposite electrode 230 described below, the first functional layer 221 and/or the second functional layer 223 may be a common layer covering an entirety of the substrate 100.

The opposite electrode 230 may be disposed on the pixel electrode 210 and may overlap the pixel electrode 210. The opposite electrode 230 may include a conductive material having a low work function. In an embodiment, the opposite electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof, for example. In an alternative embodiment, the opposite electrode 230 may further include a layer such as ITO, IZO, ZnO, or $In_2O_3$ over the (semi) transparent layer including the above material. The opposite electrode 230 may be unitary to cover an entirety of the substrate 100.

The display panel 20 may include a plurality of light-emitting devices 200, and the plurality of light-emitting devices 200 may provide an image by emitting light through the pixels PX. That is, the display area DA (refer to FIGS. 1A and 1B) may be defined by the plurality of light-emitting devices 200.

The encapsulation layer ENL may be disposed on the opposite electrode 230 of the light-emitting device 200 and may cover the light-emitting devices 200 of the display layer DISL. The encapsulation layer ENL may include at least one inorganic encapsulation layer and at least one organic encapsulation layer, and in an embodiment, FIGS. 9A to 9D illustrate that the encapsulation layer ENL includes a first inorganic encapsulation layer 310, an organic encapsulation layer 320, and a second inorganic encapsulation layer 330 that are sequentially stacked.

The first inorganic encapsulation layer 310 and the second inorganic encapsulation layer 330 may include one or more inorganic materials among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include acryl-based resin, epoxy-based resin, PI, polyethylene, or the like. In an embodiment, the organic encapsulation layer 320 may include acrylate. The organic encapsulation layer 320 may be formed or provided by curing a monomer or applying a polymer. The organic encapsulation layer 320 may be transparent.

The touch sensing layer TSL may be disposed on the encapsulation layer ENL. In an embodiment, as illustrated in FIGS. 9A to 9D, the touch sensing layer TSL may be directly formed or disposed on the encapsulation layer ENL, and in this case, an adhesive layer may not be disposed between the touch sensing layer TSL and the encapsulation layer ENL.

The touch sensing layer TSL may obtain coordinate information according to an external input, for example, a touch event. The touch sensing layer TSL may include, for example, a sensing electrode and signal lines connected to the sensing electrode. The touch sensing layer TSL may sense an external input by a mutual cap method or a self-cap method.

Although not illustrated in the drawings, an upper member illustrated in FIGS. 6A to 8 may be disposed on the touch sensing layer TSL described above. Also, an adhesive member OC may be disposed under the display panel 20, and a first protection member PF may be disposed under the adhesive member OC. In this case, at least a portion of the adhesive member OC may be inserted into the bent groove GV as illustrated in FIGS. 9A to 9D. Also, the adhesive member OC may be disposed between the first protection member PF and the substrate 100. The thickness of the adhesive member OC, which is the distance from the upper surface of the first protection member PF to the lower surface of the substrate 100, may be different from each other in various portions of the adhesive member OC. In an embodiment, the thickness of a portion of the adhesive member OC overlapping the bent groove GV may be greater than the thickness of a portion of the adhesive member OC not overlapping the bent groove GV, for example. In this case, the thickness of a portion of the adhesive member OC not overlapping the bent groove GV may be uniform.

Although it has been described above that the display apparatus 1 includes an organic light-emitting diode OLED as a light-emitting device, the display apparatus 1 of the invention is not limited thereto. In another embodiment, the display apparatus 1 may include a light-emitting display apparatus including an inorganic light-emitting diode, that is, an inorganic light-emitting display apparatus. In another embodiment, the display apparatus 1 may include a quantum dot light-emitting display apparatus. However, for convenience of description, a case where the display apparatus 1 includes an organic light-emitting diode OLED will be described below.

Figure 10A:
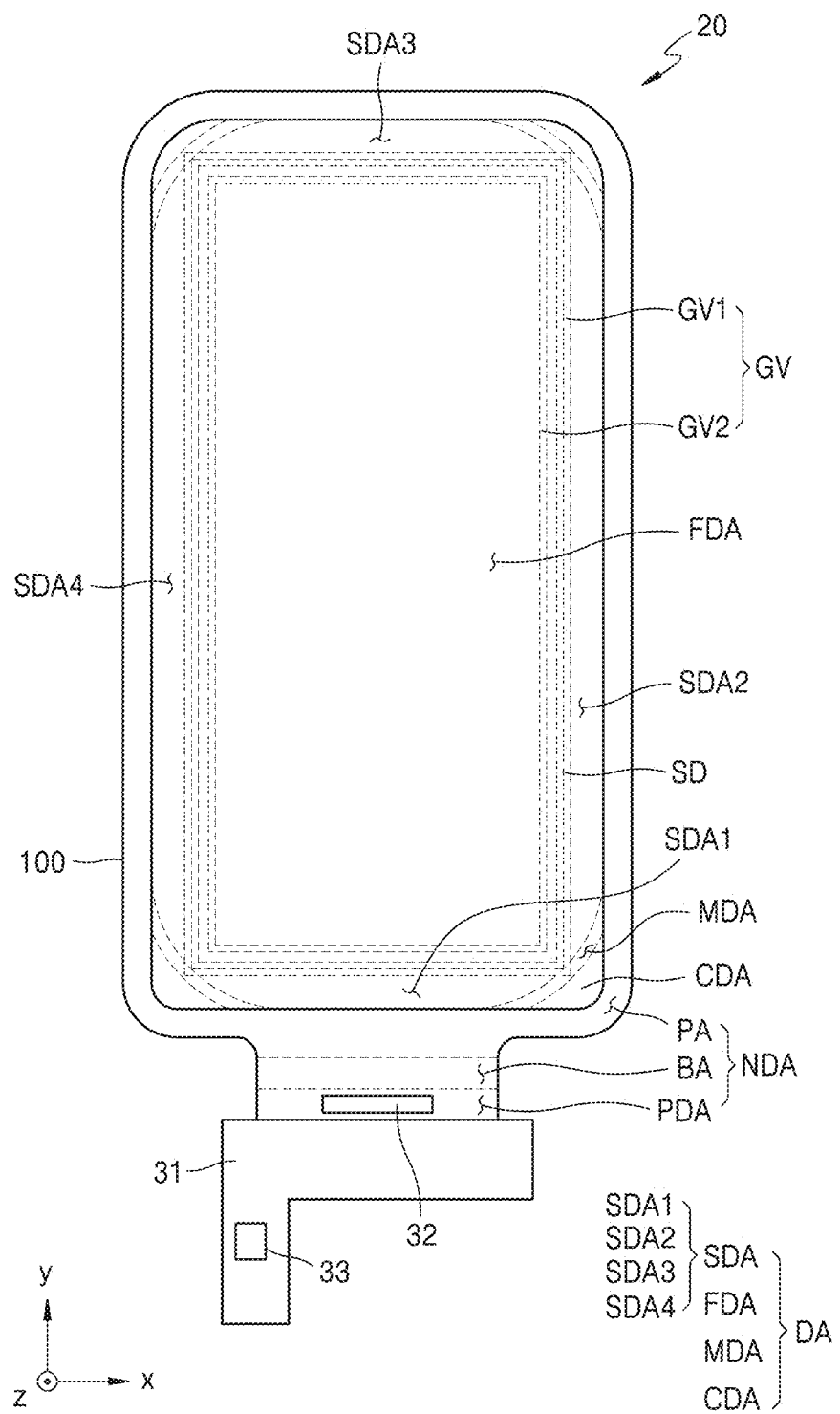
FIGS. 10A and 10B are plan views schematically illustrating another embodiment of a portion of a display panel included in a display apparatus.

FIG. 10A is a plan view schematically illustrating another embodiment of a portion of a display panel included in a display apparatus.

Referring to FIG. 10A, the display panel 20 may be the same as or similar to that described with reference to FIG. 3. Hereinafter, differences from the display panel 20 described with reference to FIG. 3 will be mainly described in detail.

The bent groove GV may be provided in plural. In this case, in the plan view, at least one of the plurality of bent grooves GV may overlap the boundary between the sub display area SDA and the main display area FDA and the boundary between the main display area FDA and the corner display area CDA. In an embodiment, in the plan view, the edge SD of the main display area FDA may be disposed inside one of the plurality of bent grooves GV, for example. In an embodiment, a plurality of bent grooves GV may be arranged between the main display area FDA and an edge of the substrate 100 to be spaced apart from each other.

In an embodiment, the plurality of bent grooves GV may include a first bent groove GV1 and a second bent groove GV2 spaced apart from each other, for example. In this case, the first bent groove GV1 and the second bent groove GV2 may be defined to correspond to the edge of the substrate 100 while defining a closed loop.

In the plan view, the first bent groove GV1 or the second bent groove GV2 described above may overlap the boundary between the sub display area SDA and the main display area FDA and the boundary between the main display area FDA and the corner display area CDA. In an embodiment, in the plan view, the first bent groove GV1 may overlap the boundary between the sub display area SDA and the main display area FDA and the boundary between the main display area FDA and the corner display area CDA, for example. In an embodiment, in the plan view, the edge SD of the main display area FDA may be disposed inside the first bent groove GV1, for example. In this case, the second bent groove GV2 may be defined in an internal space defined by the first bent groove GV1.

Although not illustrated in the drawing, the plurality of bent grooves GV may further include a third bent groove outside the first bent groove GV1.

When a plurality of bent grooves GV is provided as described above, the plurality of bent grooves GV may reduce the force desired for bending when bending the display panel 20 and may maintain the display panel 20 in a bent state by reducing the restoration force of the display panel 20 after the display panel 20 is bent.

Figure 10B:
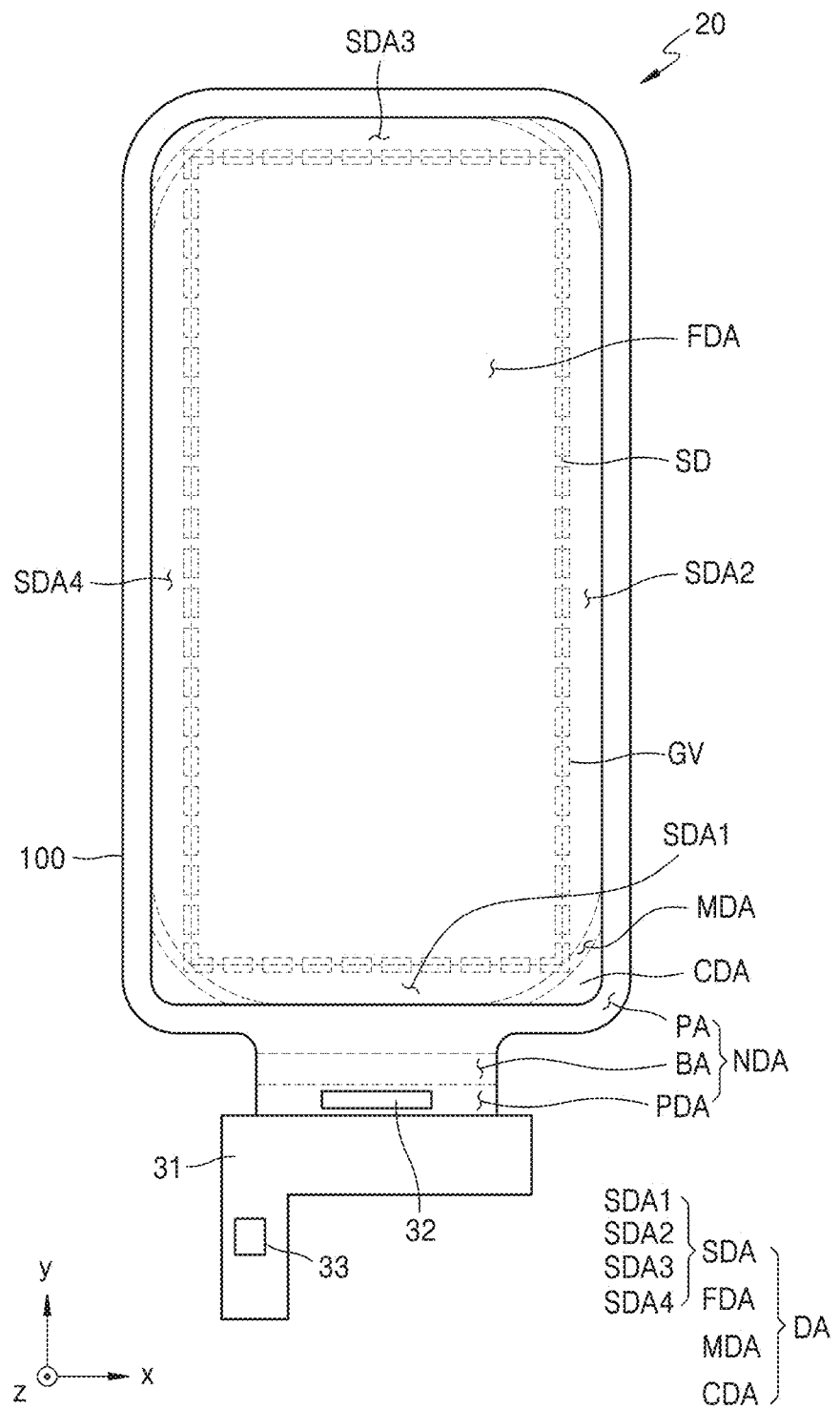

FIG. 10B is a plan view schematically illustrating another embodiment of a portion of a display panel included in a display apparatus.

Referring to FIG. 10B, the display panel 20 may be the same as or similar to that described with reference to FIG. 3. Hereinafter, differences from the display panel 20 described with reference to FIG. 3 will be mainly described in detail.

The bent groove GV may be provided in plural. In this case, in the plan view, the plurality of bent grooves GV may be spaced apart from each other along one path (for example, a closed loop line). In an embodiment, in the plan view, the plurality of bent grooves GV may overlap a line segment formed or provided along the edge of the main display area FDA, for example. In this case, the edge of the main display area FDA may be the boundary between the main display area FDA and the sub display area SDA and the boundary between the main display area FDA and the corner display area CDA. In an embodiment, in the plan view, the plurality of bent grooves GV may be spaced apart from each other along the edge SD of the main display area FDA, for example.

Figure 11A:
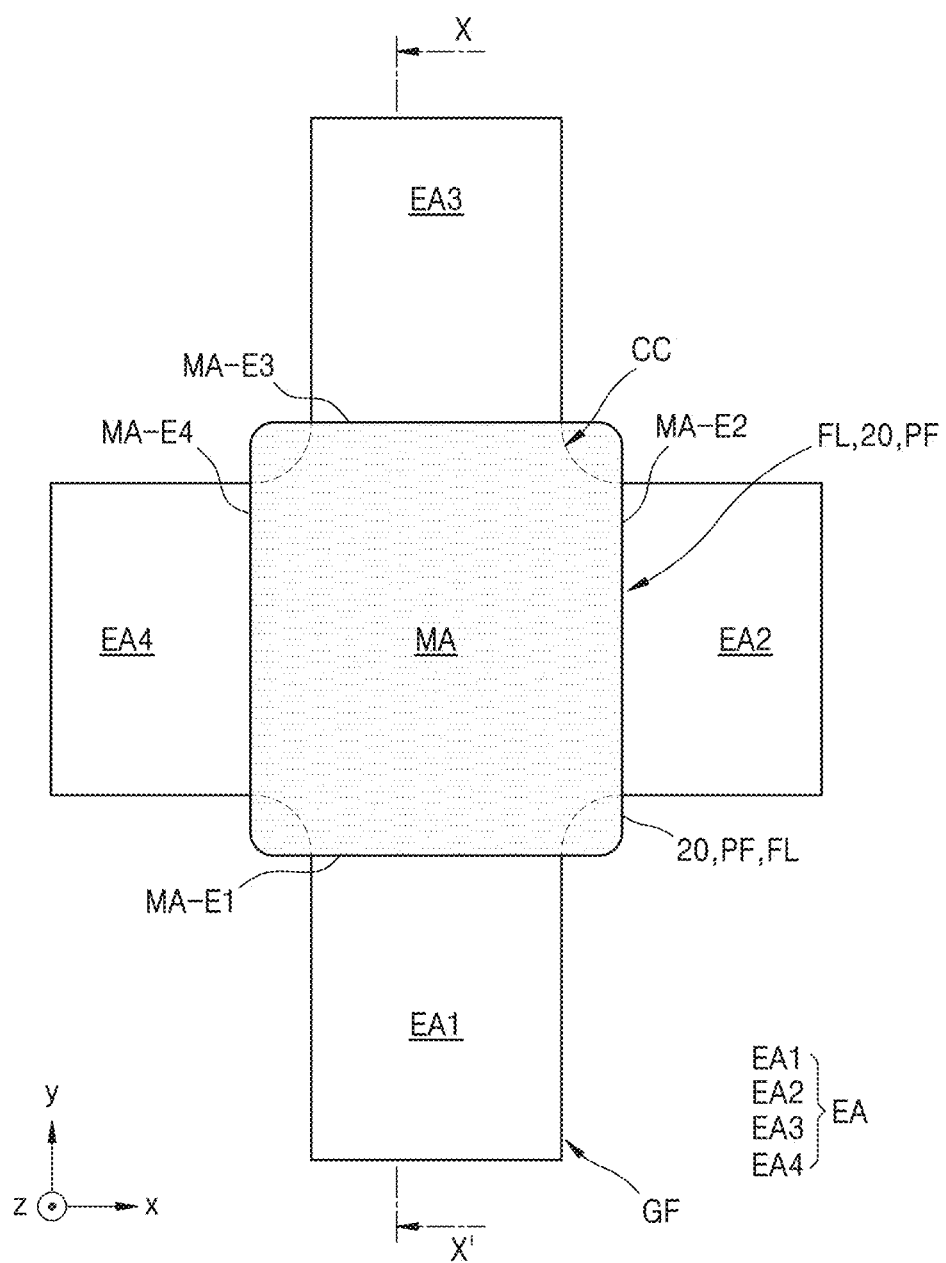
FIG. 11A is a plan view illustrating an embodiment of a display panel and a guide film.
Figure 11B:
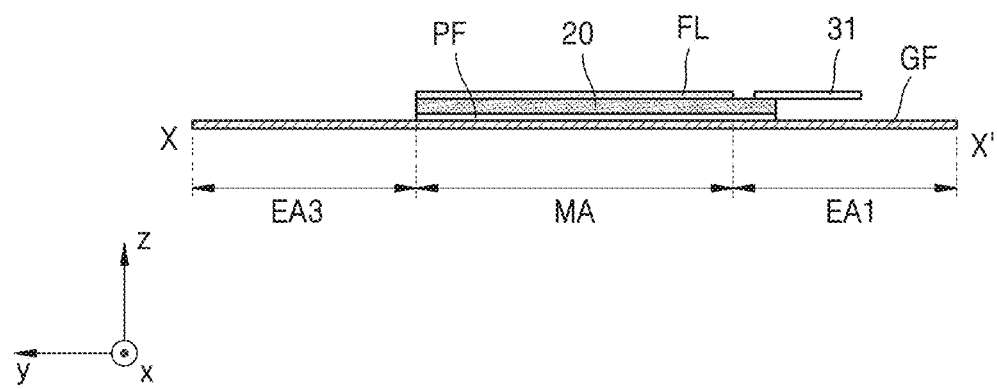
FIG. 11B is a cross-sectional view schematically illustrating an embodiment of a display apparatus of FIG. 11A taken along line X-X'.

FIG. 11A is a plan view illustrating an embodiment of a display panel and a guide film. FIG. 11B is a cross-sectional view schematically illustrating an embodiment of a display apparatus of FIG. 11A taken along line X-X'.

Referring to FIG. 11B, a guide film GF may be attached to the rear surface of the display panel 20 where the upper member FL is disposed. In this case, the upper member FL, a bending protection layer BPL (refer to FIG. 12D), and the display circuit board 31 may be arranged on the front surface of the display panel 20.

In an embodiment, when the guide film GF is attached to the lower surface of the display panel 20, the display panel 20 may be attached to correspond to a center area MA of the guide film GF. Particularly, the guide film GF may be attached such that all of the main display area FDA, the sub display area SDA, the intermediate display area MDA, and the corner display area CDA of the display panel 20 may correspond to the center area MA of the guide film GF. In this case, an edge area EA (refer to FIG. 11A) of the guide film GF may not overlap the display panel 20.

Particularly, the guide film GF may be attached to the rear surface of the display panel 20. In this case, the first protection member PF under the display panel 20 may be attached to the guide film GF.

In an embodiment, the guide film GF described above may include a center area MA and an edge area EA connected to each edge of the center area MA. In an embodiment, the guide film GF may include a first edge area EA1 connected to a first outline MA-E1 of the display panel 20, a second edge area EA2 connected to a second outline MA-E2 of the display panel 20, a third edge area EA3 connected to a third outline MA-E3 of the display panel 20, and a fourth edge area EA4 connected to a fourth outline MA-E4 of the display panel 20, for example.

The center area MA of the guide film GF may include a concave corner CC so as not to overlap the corner display area CDA of the display panel 20 in the plan view.

Although FIG. 11A illustrates that the guide film GF includes four edge areas EA, the invention is not limited thereto and a smaller or larger number of edge areas EA may be provided depending on the shape of the display apparatus 1. Also, although FIG. 11A illustrates that the edge area EA has a quadrangular (e.g., rectangular) shape in the plan view, the edge area EA may have various shapes such as a polygonal shape such as a triangular shape, a portion of a circular shape, and a portion of an elliptical shape.

In an embodiment, the guide film GF may be attached to the lower surface of the display panel 20 to overlap the display panel 20 in the plan view. The center area MA of the guide film GF may be attached to overlap the display panel 20. Moreover, although FIG. 11A illustrates that the edge of the display panel 20 corresponds to the edge of the center area MA of the guide film GF, the invention is not limited thereto.

Although not illustrated in the drawings, an adhesive layer (not illustrated) may be disposed on the guide film GF. In this case, the adhesive layer may contact the lower surface of the first protection member PF and may be an adhesive including an acrylic resin or an adhesive including a silicone resin.

FIGS. 11C to 11J are views schematically illustrating an embodiment of a method of manufacturing a display apparatus.

Figure 11C:
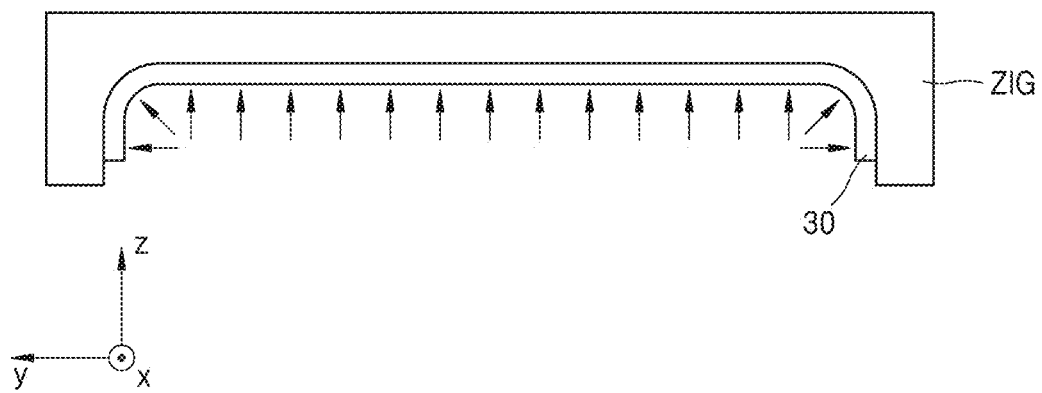
FIGS. 11C to 11J are views schematically illustrating an embodiment of a method of manufacturing a display apparatus.

Referring to FIG. 11C, in order to prepare a cover window 30, the cover window 30 may be modified to have a flat surface and a curved surface by a jig ZIG including a concave surface corresponding to the final shape of the cover window 30. That is, the jig ZIG may be a frame having the shape of a display apparatus to be finally manufactured. By adhering the cover window 30 to the concave surface of the jig ZIG, the cover window 30 may be modified according to the shape of the concave surface of the jig ZIG.

Figure 11D:
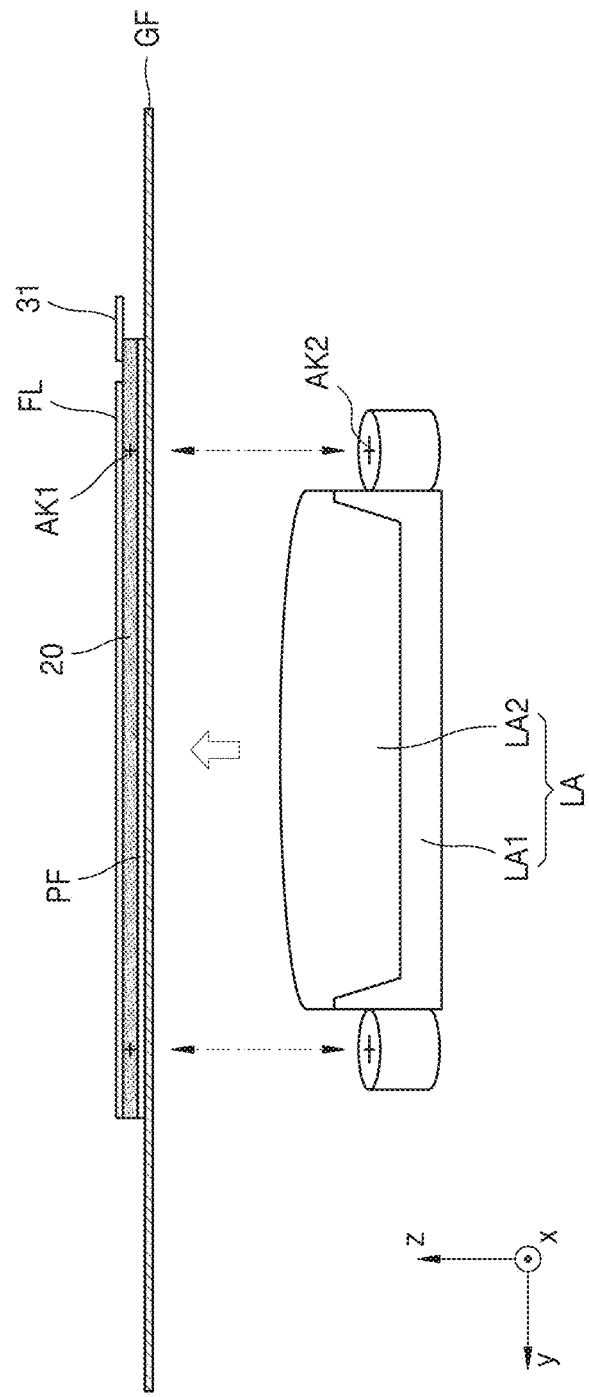

Referring to FIG. 11D, a lamination apparatus LA including a support portion LA1 and a volume change portion LA2 on the support portion LA1 may be prepared. The support portion LA1 may support the volume change portion LA2. The volume change portion LA2 may include or may be connected to an air pump. Because the volume change portion LA2 has a low modulus, the shape and volume of the volume change portion LA2 may vary through the air pump according to the air pressure. In an alternative embodiment, the volume change portion LA2 may include a diaphragm.

The rear surface of the display panel 20 may face the lamination apparatus LA. That is, the guide film GF may be placed on the side of the lamination apparatus LA. Next, the display panel 20 and the lamination apparatus LA may be aligned. In an embodiment, the display panel 20 and the lamination apparatus LA may be aligned such that a first alignment key AK1 displayed on the display panel 20 and a second alignment key AK2 displayed on the lamination apparatus LA match each other, for example.

Figure 11E:
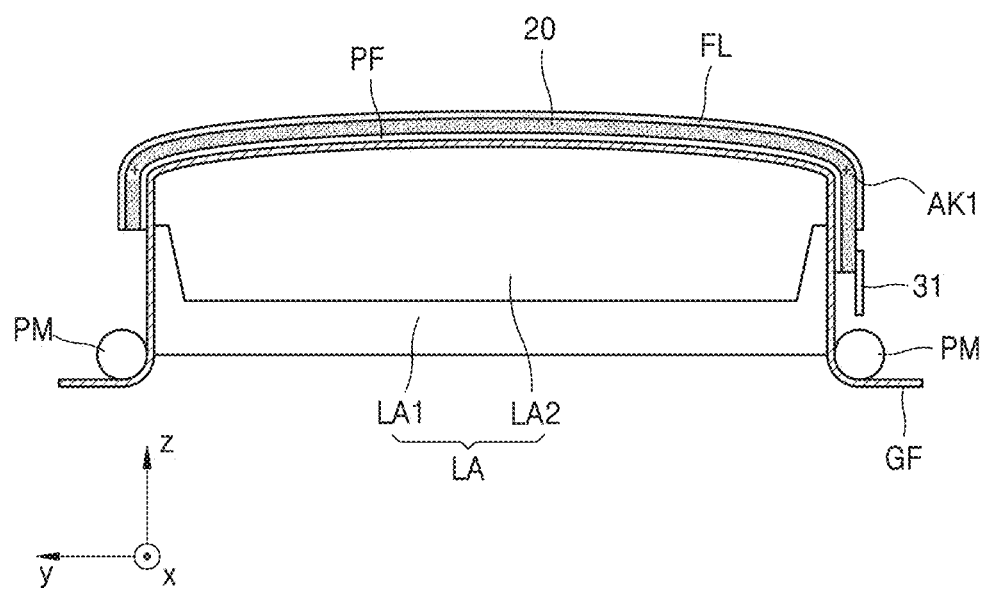

Referring to FIGS. 11E and 11A, the display panel 20 may be pre-formed through the guide film GF. In an embodiment, the shape of the display panel 20 may be modified by applying an external force, for example, a tensile force, to the guide film GF, for example.

Particularly, the guide film GF may be seated on the lamination apparatus LA. A push member PM may be disposed on the guide film GF, and the guide film GF may be adhered to the side surface of the lamination apparatus LA by the push member PM. In an embodiment, when the push members PM respectively press the edge areas EA of the guide film GF, a tensile force may be applied to the guide film GF and the guide film GF may be modified along the outer surface of the lamination apparatus LA and thus the display panel 20 on the guide film GF may also be suitably modified such as bent, for example.

In this case, the display panel 20, the upper member FL, and the first protection member PF may be bent. In this case, the adhesion may be separated between the first protection member PF and the guide film GF. Particularly, when the display panel 20 is pre-formed as described above, the upper member FL and the first protection member PF may be bent like the display panel 20. In this case, each of the display panel 20, the upper member FL, and the first protection member PF may be returned to a flat state due to the elastic modulus of the display panel 20, the upper member FL, and the first protection member PF. By this restoration force, the first protection member PF and the guide film GF may be separated from each other. Particularly, because such a portion is excessively generated in at least one of the sub display area SDA and the corner display area CDA of the display panel 20, the shape of the display panel 20 may not be similar to the shape of the cover window 30 when the display panel 20 is pre-formed. In this case, even when the display panel 20 is attached to the cover window 30, the cover window 30 and the display panel 20 may fail to be adhered to each other in the sub display area SDA and the corner display area CDA of the display apparatus 1. The bent groove GV may reduce the above problem. That is, as described above, when the bent groove GV is defined on the substrate 100, the elastic modulus of a portion of the display panel 20 where the bent groove GV is defined may be less than the elastic modulus of another portion of the display panel 20 where the bent groove GV is not defined. In this case, as described above, the bent groove GV may overlap the edge of the main display area FDA of the display panel 20 and the edge of the main display area FDA may be the same as or adjacent to a portion where bending is started and accordingly, a portion of the display panel 20 including the bent groove GV may be more easily bent than a portion of the display panel 20 where the bent groove GV is not defined. In addition, after the display panel 20 is bent, the display panel 20 may maintain the bent state for a long time. Thus, the first protection member PF may not be separated from the guide film GF. Particularly, the first protection member PF, the display panel 20, and the upper member FL may vary such that it may correspond to the shape of the guide film GF without being separated from the adhesive layer of the guide film GF at an edge portion of the first protection member PF. Also, after the first protection member PF, the display panel 20, and the upper member FL are modified according to the modification of the guide film GF, the modification of each of the first protection member PF, the display panel 20, and the upper member FL may be maintained.

Figure 11F:
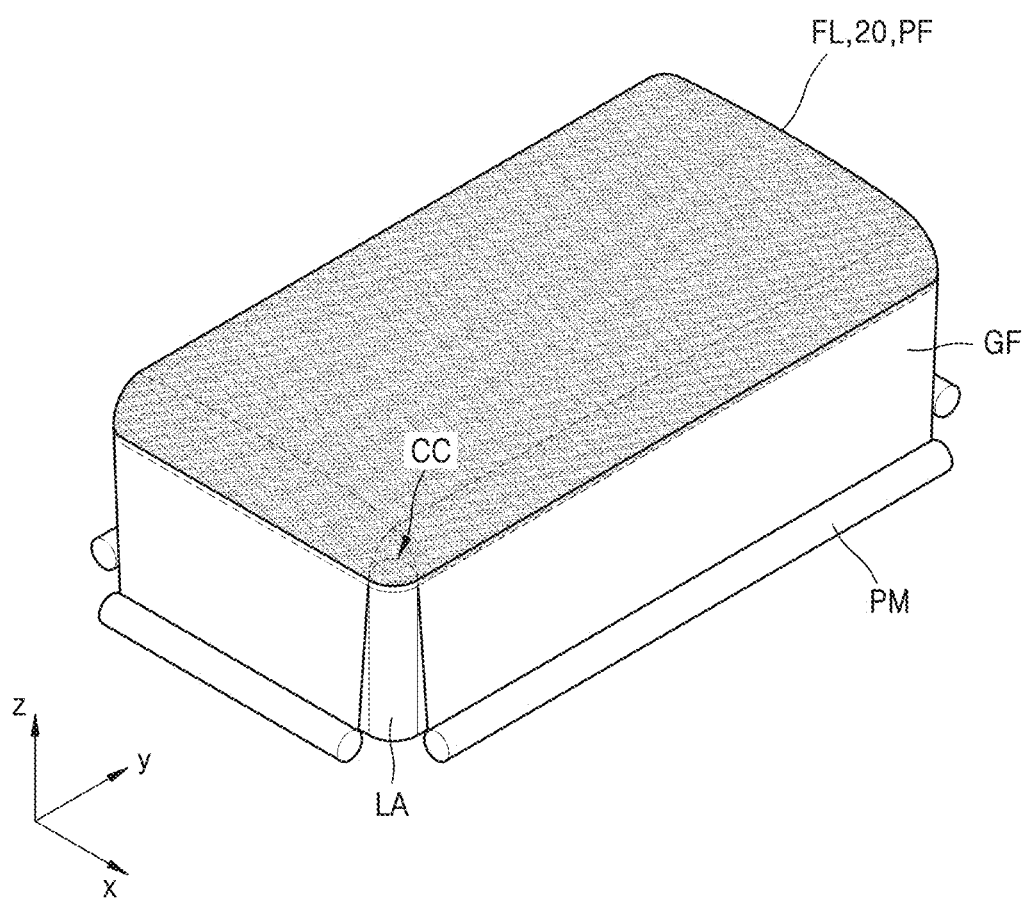

Referring to FIG. 11F, the shape of the upper member FL, the display panel 20, and the first protection member PF pre-formed through the guide film GF may be identified.

Figure 11G:
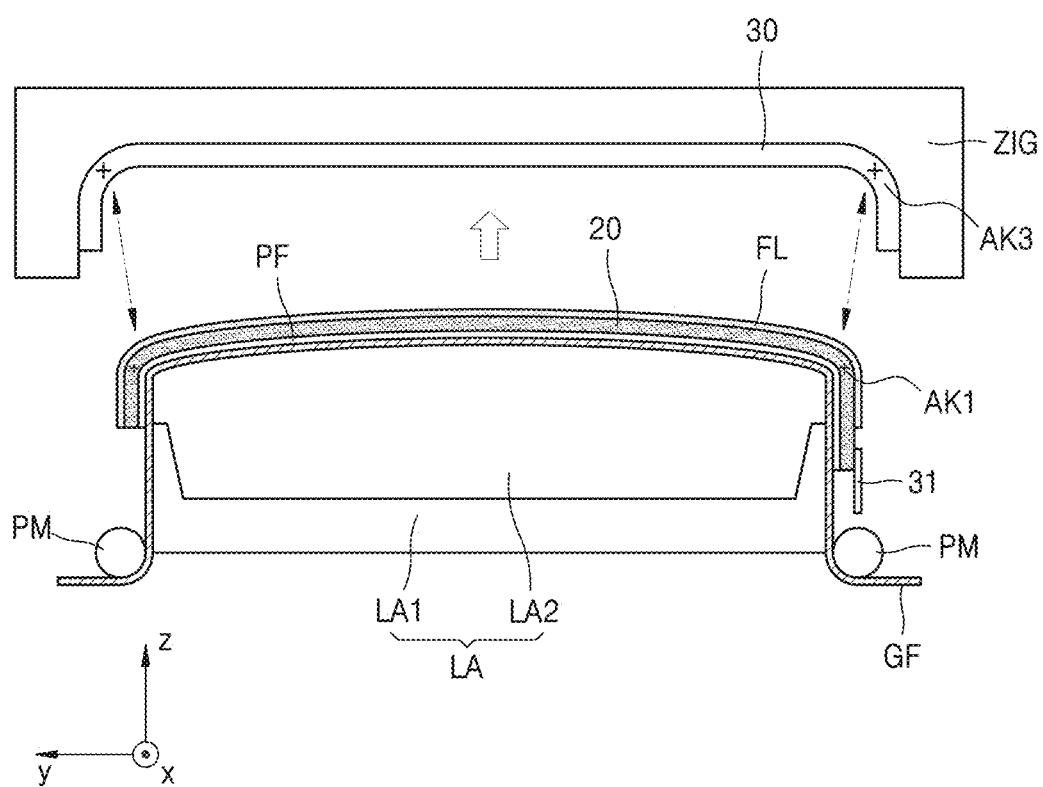

Referring to FIG. 11G, after the display panel 20 is pre-formed, the front surface of the display panel 20 may face the cover window 30 and the display panel 20 and the cover window 30 may be aligned. The display panel 20 and the cover window 30 may be aligned such that a first alignment key AK1 displayed on the display panel 20 and a third alignment key AK3 displayed on the cover window 30 match each other.

Figure 11H:
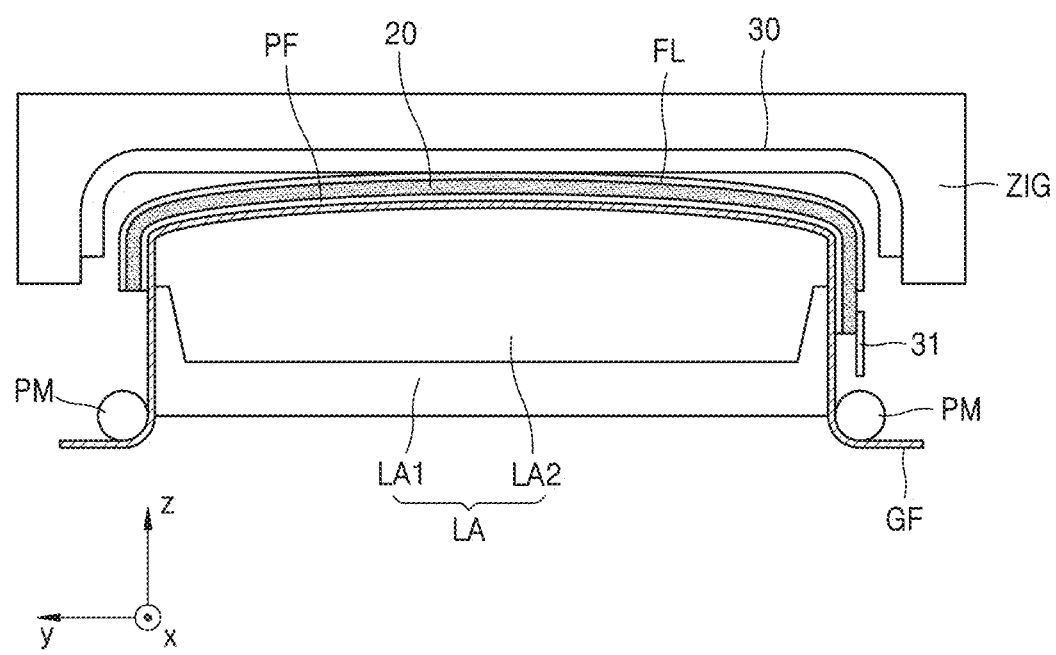
Figure 11I:
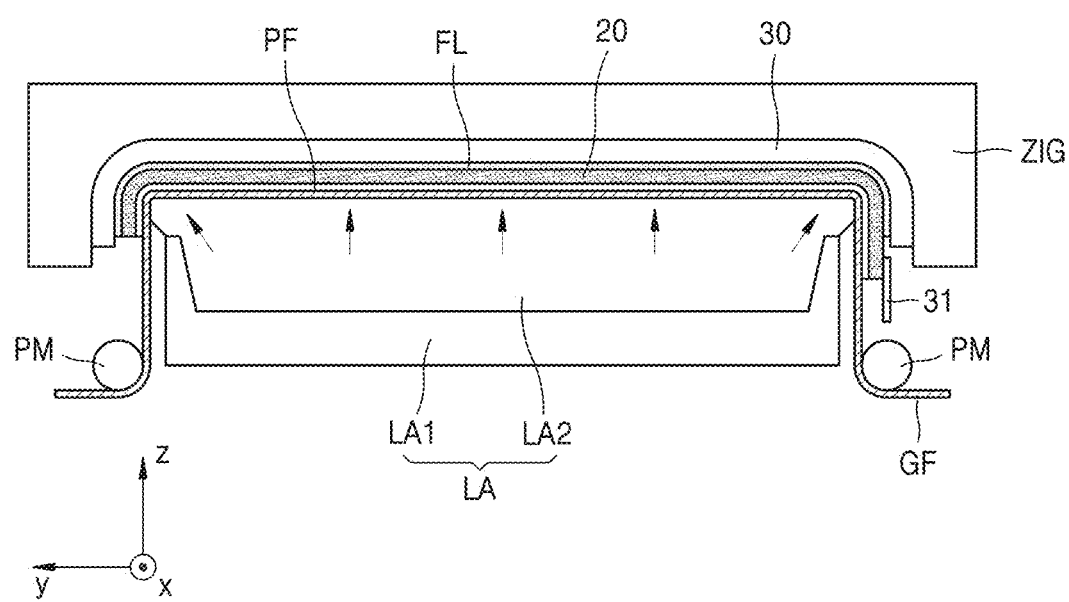

Referring to FIGS. 11H and 11I, the cover window 30 may be attached to the front surface of the display panel 20. In an embodiment, as illustrated in FIG. 11H, a portion of the display panel 20 may be first attached to the cover window 30, for example. In the final shape of the display panel 20, a flat surface (e.g., the main display area FDA) having no curvature may be first attached to the cover window 30.

Next, as illustrated in FIG. 11I, as the shape of the volume change portion LA2 of the lamination apparatus LA changes and the volume thereof increases, the other portions of the display panel 20, for example, the sub display area SDA and the corner display area CDA may be attached to the cover window 30.

The processes of attaching the cover window 30, the sub display area SDA, and the corner display area CDA may be simultaneously performed. In an embodiment, when the sub display area SDA and the cover window 30 are attached to each other, the corner display area CDA may be naturally adhered to the cover window 30 by a peripheral external force, for example. In another embodiment, the processes of attaching the sub display area SDA and the corner display area CDA to the cover window 30 may be performed at different times. In an embodiment, the sub display area SDA and the cover window 30 may be attached to each other first, and then, the corner display area CDA and the cover window 30 may be attached to each other, for example.

Figure 11J:
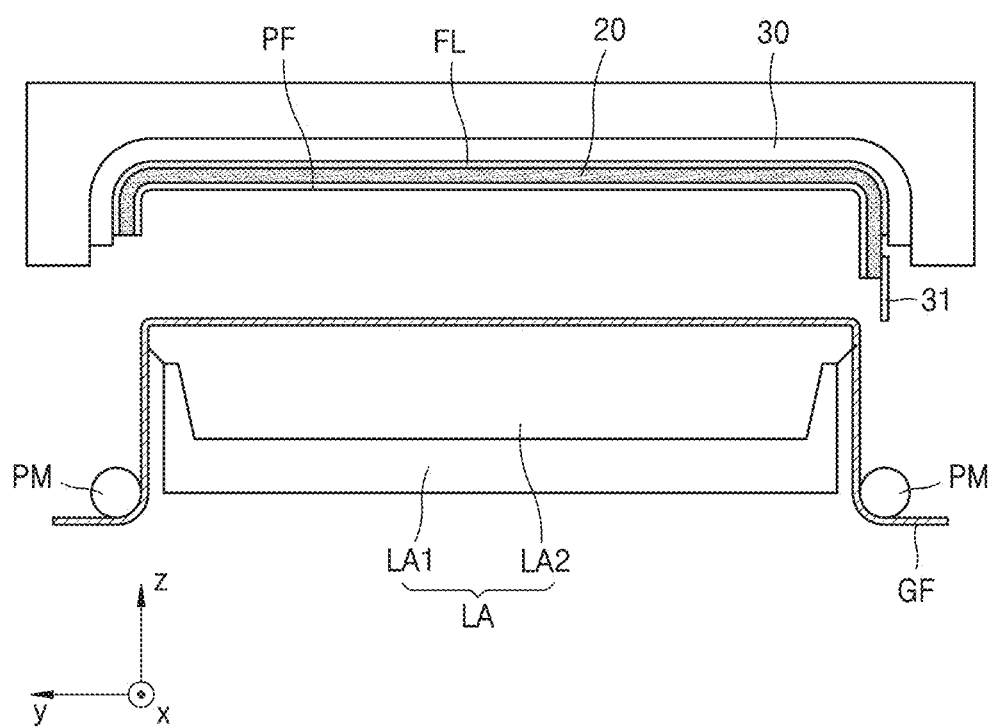

Referring to FIG. 11J, after an operation of attaching the display panel 20 to the cover window 30 is performed, the guide film GF may be removed from the display panel 20 to which the cover window 30 is attached. In an embodiment, ultra-violet ("UV") light may be irradiated to an adhesive member (not illustrated) for adhering the guide film GF and the display panel 20 to each other and the adhesive force of the adhesive member may be weakened to separate the guide film GF and the display panel 20 from each other, for example.

When the above process is completed, an operation of curing the cover window 30 and the display panel 20 may be performed. In an embodiment, curing may be performed by irradiating the UV light to the cover window 30 and the display panel 20, for example. When the UV light is irradiated to the cover window 30 and the display panel 20, air bubbles or the like may escape from the adhesive member attached to the display panel 20.

Although the descriptions given above with reference to FIGS. 11I to 11J have been made by the display apparatus 1 of FIG. 1B in an embodiment, this is merely for convenience of description and the above descriptions may also be similarly applied to the display apparatus 1 of FIG. 1A. In this case, the description of the corner display area CDA of the display apparatus 1 of FIG. 1B may be applied to the display apparatus corner area DCA of the display apparatus 1 of FIG. 1A.

In the above case, the cover window 30, the upper member FL, the display panel 20, and the first protection member PF may be sequentially stacked.

FIGS. 12A to 12D are side views schematically illustrating an embodiment of a method of manufacturing a display apparatus.

Figure 12A:
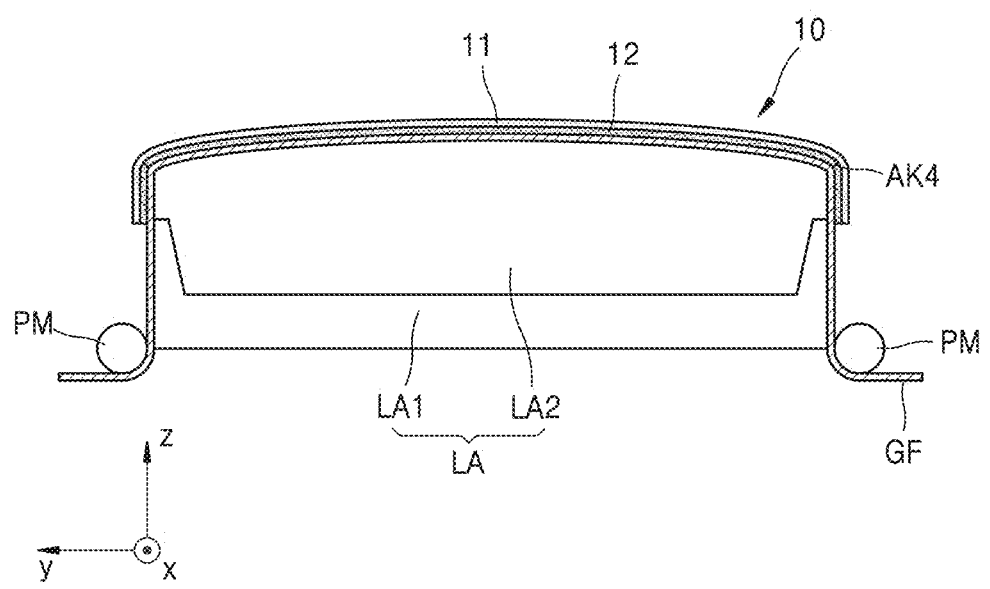
FIGS. 12A to 12D are side views schematically illustrating an embodiment of a method of manufacturing a display apparatus.
Figure 12B:
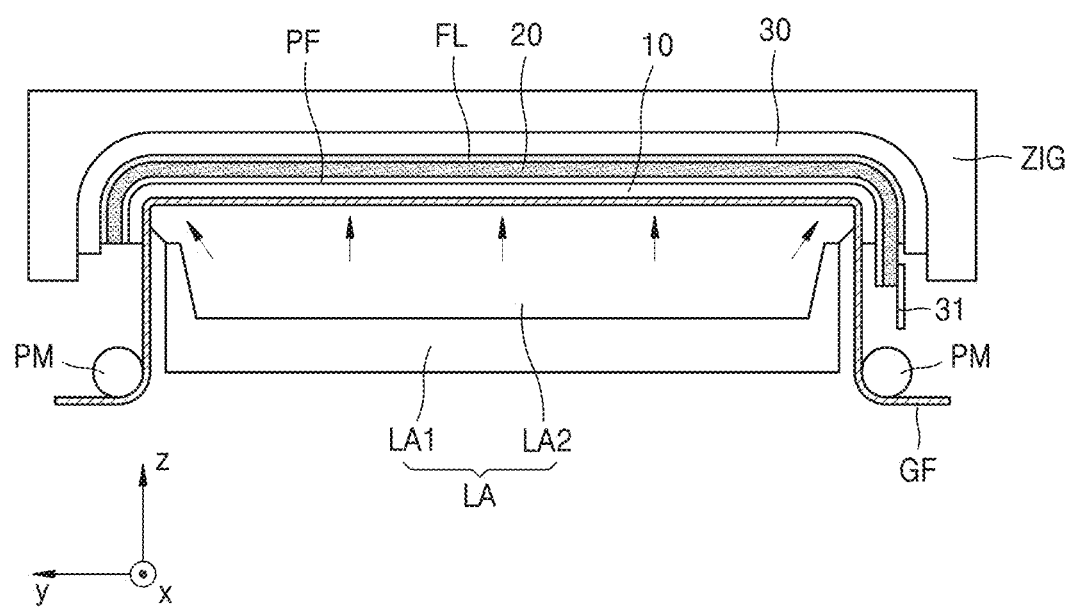

Referring to FIGS. 12A and 12B, the upper member FL, the display panel 20, and the first protection member PF may be attached to the cover window 30, and then, the second protection member 10 may be attached to the first protection member PF. In an embodiment, a method of attaching the second protection member 10 may be similar to the above method of attaching the display panel 20 to the cover window 30. In another embodiment, the second protection member 10 may face the first protection member PF, and then, the second protection member 10 may be pressed through a silicon pad or the like so that the second protection member 10 contacts the first protection member PF. In another embodiment, the second protection member 10 may face the first protection member PF, and then, the second protection member 10 may be attached to the first protection member PF through a roller or the like being linearly moved and reciprocated on one surface of the second protection member 10. However, hereinafter, for convenience of description, a case where a method of attaching the second protection member 10 to the first protection member PF is similar to a method of attaching the display panel 20 to the cover window 30 will be mainly described in detail.

The second protection member 10 may be disposed on the guide film GF as described above, and then, the lamination apparatus LA including the support portion LA1 and the volume change portion LA2 on the support portion LA1 may be prepared. The support portion LA1 may support the volume change portion LA2. The volume change portion LA2 may include or may be connected to an air pump. Because the volume change portion LA2 has a low modulus, the shape and volume of the volume change portion LA2 may vary through the air pump according to the air pressure. In an alternative embodiment, the volume change portion LA2 may include a diaphragm.

The rear surface of the second protection member 10 may face the lamination apparatus LA. That is, the guide film GF may be placed on the side of the lamination apparatus LA. Next, the second protection member 10 and the lamination apparatus LA may be aligned. In an embodiment, the second protection member 10 and the lamination apparatus LA may be aligned such that a fourth alignment key AK4 displayed on the second protection member 10 and a second alignment key AK2 displayed on the lamination apparatus LA match each other, for example.

Thereafter, the second protection member 10 may be pre-formed through the guide film GF. Because the pre-forming method is similar to the pre-forming of the display panel 20 described above, redundant descriptions thereof will be omitted for conciseness.

Referring to FIG. 12B, the pre-formed second protection member 10 may be attached to the rear surface of the first protection member PF. In this case, although not illustrated in the drawings, an adhesive layer may be disposed on the upper surface of the second protection member 10 or the rear surface of the first protection member PF. In this case, because a method of attaching the second protection member 10 to the first protection member PF is similar to the method of attaching the display panel 20 to the cover window 30 described with reference to FIGS. 11H and 11I, redundant descriptions thereof will be omitted for conciseness.

Figure 12C:
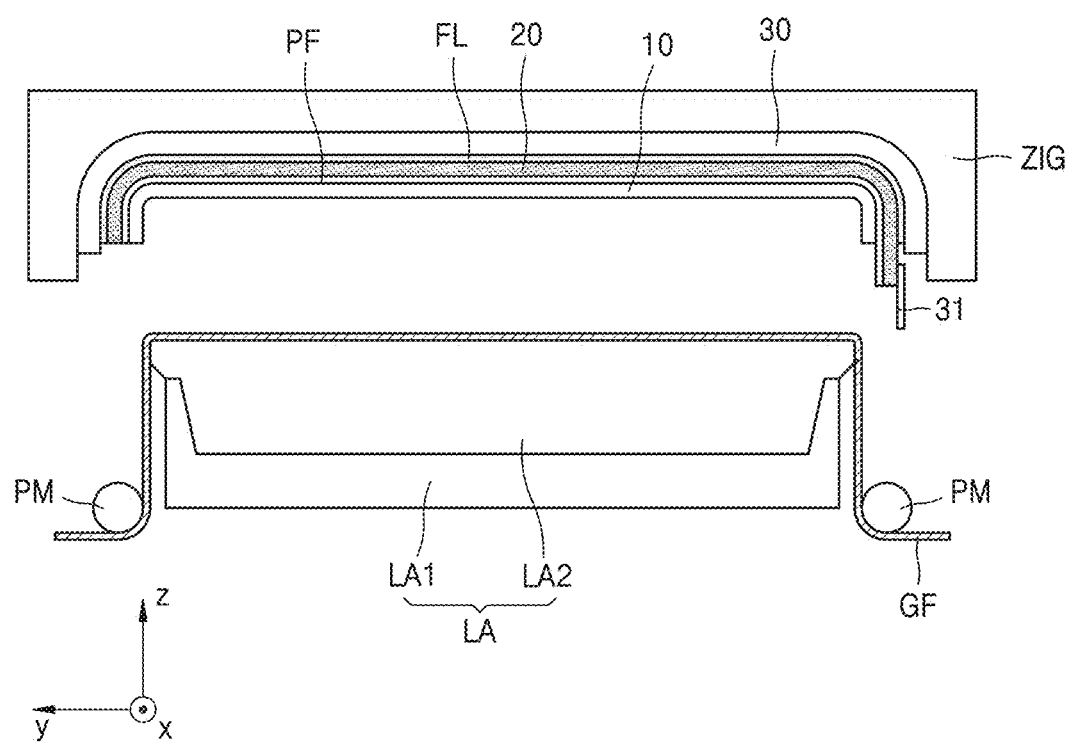

Referring to FIG. 12C, the second protection member 10 may be attached to the display panel 20, and then, the guide film GF may be separated from the second protection member 10.

Figure 12D:
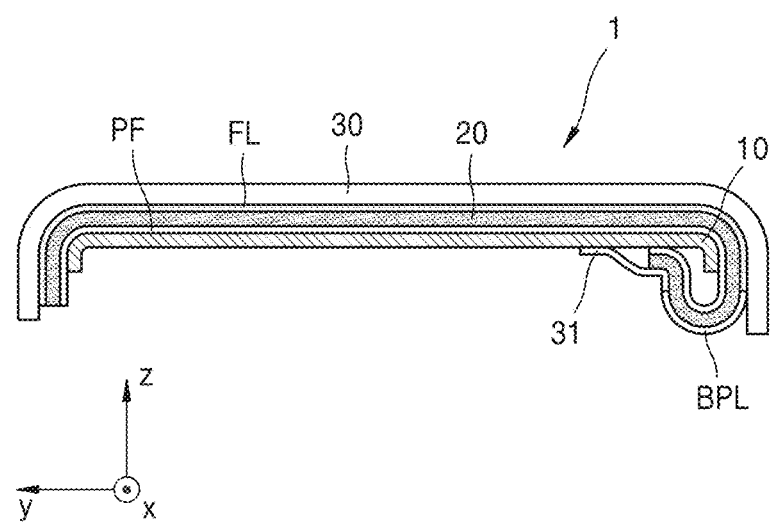

Referring to FIG. 12D, the second protection member 10 may be attached to the rear surface of the first protection member PF, and then, a portion of the display panel 20, a portion of the first protection member PF, or the like may be bent to attach the display circuit board 31 to the rear surface of the second protection member 10. In this case, although not illustrated in the drawings, a spacer including a material such as PET may be disposed on the rear surface of the second protection member 10, and the display circuit board 31 may be disposed at the spacer.

The display panel in embodiments may be changed into various shapes because portions having different elastic moduli are formed or provided. The display apparatus in embodiments may maintain the shape of the curved portion of the display panel in the curved portion.

The display panel and the display apparatus in embodiments may display an image even at a side surface and/or a corner in order to reduce the area of the non-display area and increase the area of the display area.

However, the scope of the invention is not limited to these effects.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display panel comprising:
   a substrate including:
      a main display area disposed at a center thereof;
      a plurality of sub display areas disposed outside the main display area; and
      a display panel corner area disposed between sub display areas of the plurality of sub display areas adjacent to each other and arranged at a corner of the substrate; and
   display elements arranged on the substrate,
   wherein a bent groove is defined in the substrate, between the main display area and at least one sub display area of the plurality of sub display areas of the substrate, and between the main display area and the display panel corner area.

2. The display panel of claim 1, wherein an inner surface of the bent groove is rounded.

3. The display panel of claim 1, wherein an edge of the bent groove is inclined.

4. The display panel of claim 1, wherein an edge of the bent groove is stepped.

5. The display panel of claim 1, wherein the bent groove is defined in a closed loop shape along an edge of the substrate.

6. The display panel of claim 5, wherein the bent groove is provided in plural, and
   a plurality of bent grooves is arranged between the main display area and an edge of the substrate to be spaced apart from each other.

7. The display panel of claim 6, wherein at least one of the plurality of bent grooves overlaps a boundary between the main display area and the sub display area of the substrate and a boundary between the main display area and the display panel corner area.

8. The display panel of claim 1, wherein the bent groove is provided in plural, and
a plurality of bent grooves are spaced apart from each other along a closed loop line, and overlap a line segment formed along a boundary between the main display area and the sub display area of the substrate and a boundary between the main display area and the display panel corner area.

9. A display apparatus comprising:
a cover window including a curved corner; and
a display panel disposed on the cover window and including:
display elements;
a main display area;
a sub display area;
a display panel corner area facing the curved corner of the cover window, and
a substrate on which the display elements are arranged,
wherein a bent groove is defined in the substrate, between the main display area and the sub display area and between the main display area and the display panel corner area.

10. The display apparatus of claim 9, wherein an inner surface of the bent groove is rounded.

11. The display apparatus of claim 9, wherein an edge of an inner surface of the bent groove is inclined.

12. The display apparatus of claim 9, wherein an edge of an inner surface of the bent groove is stepped.

13. The display apparatus of claim 9, wherein the bent groove is defined in a closed loop shape along an edge of the substrate.

14. The display apparatus of claim 9, wherein the bent groove overlaps a boundary between the main display area and the sub display area and a boundary between the main display area and the display panel corner area.

15. The display apparatus of claim 9, wherein the display elements are arranged in the main display area, the sub display area, and the display panel corner area to be spaced apart from each other.

16. The display apparatus of claim 9, wherein the bent groove is provided in plural, and
a plurality of bent grooves is arranged between the main display area and an edge of the substrate to be spaced apart from each other.

17. The display apparatus of claim 16, wherein at least one of the plurality of bent grooves overlaps a boundary between the main display area and the sub display area and a boundary between the main display area and the display panel corner area.

18. The display apparatus of claim 9, wherein the bent groove is provided in plural, and
a plurality of bent grooves are spaced apart from each other along a closed loop line, and overlap a line segment formed along a boundary between the main display area and the sub display area and a boundary between the main display area and the display panel corner area.

19. The display apparatus of claim 9, further comprising a first protection member disposed under the display panel.

20. The display apparatus of claim 19, further comprising a second protection member disposed under the first protection member.

* * * * *